US011996359B2

(12) United States Patent
Ovard et al.

(10) Patent No.: US 11,996,359 B2
(45) Date of Patent: *May 28, 2024

(54) APPARATUSES INCLUDING BALL GRID ARRAYS AND ASSOCIATED SYSTEMS AND METHODS

(71) Applicant: Micron Technology, Inc., Boise, ID (US)

(72) Inventors: David K. Ovard, Meridian, ID (US); Thomas Hein, Munich (DE); Timothy M. Hollis, Meridian, ID (US); Walter L. Moden, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/312,801

(22) Filed: May 5, 2023

(65) Prior Publication Data
US 2023/0275016 A1   Aug. 31, 2023

Related U.S. Application Data

(63) Continuation of application No. 17/334,447, filed on May 28, 2021, now Pat. No. 11,670,578.

(60) Provisional application No. 63/033,380, filed on Jun. 2, 2020.

(51) Int. Cl.
H01L 23/48 (2006.01)
H01L 23/00 (2006.01)
H01L 23/498 (2006.01)

(52) U.S. Cl.
CPC .. *H01L 23/49838* (2013.01); *H01L 23/49816* (2013.01); *H01L 23/49822* (2013.01); *H01L 24/16* (2013.01); *H01L 2224/16227* (2013.01); *H01L 2924/15311* (2013.01); *H01L 2924/18161* (2013.01)

(58) Field of Classification Search
CPC .................. H01L 23/49816; H01L 23/49838
See application file for complete search history.

(56) References Cited

U.S. PATENT DOCUMENTS

| 6,662,250 | B1 | 12/2003 | Peterson |
| 7,375,983 | B2 | 5/2008 | Djordjevic et al. |
| 7,501,709 | B1 | 3/2009 | Hool et al. |
| 8,344,266 | B2 | 1/2013 | Bird et al. |
| 9,089,060 | B1 | 7/2015 | Azeroual et al. |

(Continued)

*Primary Examiner* — Nicholas J Tobergte
(74) *Attorney, Agent, or Firm* — TraskBritt

(57) ABSTRACT

Apparatuses may include a device substrate including a microelectronic device and bond pads proximate to an active surface of the device substrate. A package substrate may be secured to the device substrate, the package substrate configured to route signals to and from the bond pads. A ball grid array may be supported on, and electrically connected to, the package substrate. Each ball positioned and configured to carry a high-bandwidth data signal or a high-frequency clock signal may be located laterally or longitudinally adjacent to no more than one other ball of the ball grid array configured to carry a high-bandwidth data signal or a high-frequency clock signal. Each ball positioned and configured to carry a high-bandwidth data signal may be located only diagonally adjacent to any other balls configured to carry a high-bandwidth data signal or a high-frequency clock signal.

20 Claims, 15 Drawing Sheets

(56) References Cited

U.S. PATENT DOCUMENTS

| | | |
|---|---|---|
| 9,907,156 B1 | 2/2018 | Anand et al. |
| 10,455,690 B1 | 10/2019 | Chengson et al. |
| 10,937,753 B1 | 3/2021 | Kariyazaki |
| 11,670,578 B2 * | 6/2023 | Ovard .................... H01L 24/16 257/668 |
| 2002/0125570 A1 | 9/2002 | Wu et al. |
| 2005/0093152 A1 | 5/2005 | Fjelstad et al. |
| 2007/0019494 A1 | 1/2007 | Moosrainer et al. |
| 2008/0079455 A1 | 4/2008 | Vollrath et al. |
| 2010/0101846 A1 | 4/2010 | Underwood et al. |
| 2010/0195277 A1 | 8/2010 | Xue et al. |
| 2015/0061128 A1 | 3/2015 | Ramakrishnan et al. |
| 2016/0181189 A1 | 6/2016 | Qian et al. |
| 2018/0331035 A1 | 11/2018 | Zhang et al. |
| 2020/0162112 A1 | 5/2020 | Cha et al. |
| 2022/0068778 A1 | 3/2022 | Leslie et al. |

\* cited by examiner

FIG. 8

Top section (802):

| LBDQS | VDD | VSS | VDDQ | VDD | VSS | TEN | VDD | VDDQ | VDD | VDDQ | RESET | VDD |
|---|---|---|---|---|---|---|---|---|---|---|---|---|
| VSS | VDDQ | DQ | VSS | DQ | VDDQ | VDDQ | VSS | CA | CA | VSS | CA | VSS |
| ZQ | DQ | DM/TDQS | TDQS | DQ | VSS | CK | CK | CA | CA | CA | CA | VPP |

Bottom section (702):

| VPP | DQ | DQS | DQS | DQ | VSS | VDD | CS | CA | CA | CA | CA | VSS |
|---|---|---|---|---|---|---|---|---|---|---|---|---|
| VSS | VDDQ | DQ | VSS | DQ | VDDQ | MIR | VSS | CA | CA | VSS | CA | VSS |
| LBDQ | VDD | VSS | VDDQ | VDD | VSS | CA_ODT | ALERT | VDDQ | VDD | VDDQ | CA | VDD |

800, 804

US 11,996,359 B2

APPARATUSES INCLUDING BALL GRID ARRAYS AND ASSOCIATED SYSTEMS AND METHODS

CROSS-REFERENCE TO RELATED APPLICATION

This application is a continuation of U.S. patent application Ser. No. 17/334,447, filed May 28, 2021, now U.S. Pat. No. 11,670,578, issued Jun. 6, 2023, which claims the benefit under 35 U.S.C. § 119(e) of U.S. Provisional Patent Application Ser. No. 63/033,380, filed Jun. 2, 2020, for "Ball Grid Arrays and Associated Semiconductor Device Packages," the disclosure of each of which is hereby incorporated herein in its entirety by this reference.

FIELD

This disclosure relates generally to techniques for configuring ball grid arrays of microelectronic device packages. More specifically, disclosed embodiments relate to ball grid arrays and associated signal routing between the ball grid arrays and associated microelectronic devices, which embodiments may reduce crosstalk and improve signal quality, particularly at high bandwidths and clock speeds.

BACKGROUND

A significant purpose of microelectronic device (e.g., semiconductor die) packaging is to connect the device to higher-level packaging of an electronic system. One aspect of packaging is the translation of signals from the relatively small features (e.g., bond pads or rerouted bond pads) of the die to larger and more widely spaced connection locations of a next higher level package, such as a circuit board. One favored package configuration is the so-called ball grid array (BGA) package in which conductive traces extend from locations on one side of a package substrate arranged and spaced to connect to closely spaced rows of bond pads of the die to an array of discrete conductive elements, often in the form of solder bumps or balls, arranged in rows and columns and at greater pitches (i.e., center-to-center spacing) on an opposite side of the package substrate. Robust coupling between the device and higher-level packaging of a system is critical, particularly at higher signal speeds.

Signal optimization at the internal die level to support various performance aspects, such as power, latency, and internal jitter reduction, may be a function of die bond pad order to minimize data path and clock tree lengths, adequate power delivery to circuits through appropriate numbers of interspersed power and ground connections, and/or minimization of overall die size to cost reduction. However, the pattern and pitch, or "ballout," definition of the balls of a BGA are generally dictated by industry-wide (i.e., JEDEC) standards, taking into account the applications in which the microelectronic device package is expected to operate. Accordingly, opportunities for performance optimization in signal paths of the package substrate are limited. The problems of signal crosstalk attributable to signal coupling between adjacent balls is exacerbated as signal speeds increase with increasing bandwidth, clock speed increases, and ball pitch decreases. In specific examples, increasing memory capacity and operating speeds of double data rate (DDR) dynamic random access memory (DRAM) in the form of synchronous DRAM (SDRAM) and graphics double data rate (GDDR) DRAM present challenges in this regard.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 8 is a schematic of one half of another conventional ball grid array known to the inventors, including labelling of signals to be carried by the ball grid array;

DETAILED DESCRIPTION

Figure 1:
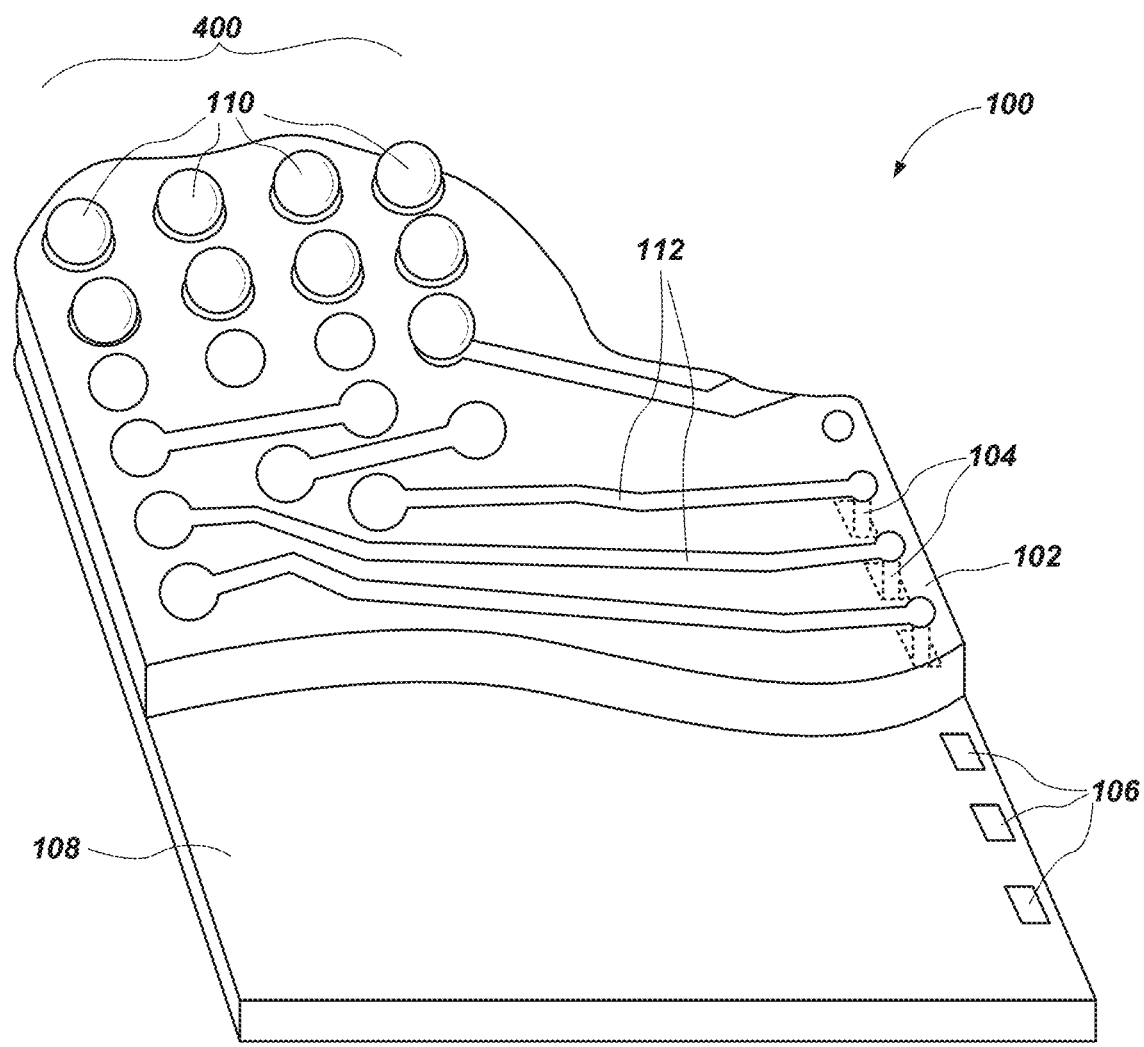
FIG. 1 is a bottom perspective, partially transparent view of a quadrant of a microelectronic device package including a ball grid array and a packaging substrate utilizing signal routing techniques in accordance with this disclosure.

Disclosed embodiments relate generally to ball grid arrays (and other arrayed electrical interconnects) and associated signal routing between the ball grid arrays and associated microelectronic devices, which embodiments may reduce crosstalk and improve signal quality, particularly at high bandwidths and clock speeds. More specifically, disclosed are embodiments of ball grid arrays and associated signal routing between the ball grid arrays and associated microelectronic devices which may distribute balls of the ball grid array configured to carry high-bandwidth data signals, high-frequency clock signals, error detect codes, or data bus inversions and, optionally, other balls of the ball grid array configured to carry low-bandwidth data signals, to reduce adjacency between such balls. For example, those balls configured to carry high-bandwidth data signals or high-frequency clock signals may be located laterally and longitudinally adjacent to no more than one other ball of the ball grid array configured to carry another of a high-bandwidth data signal or a high-frequency clock signal. As another example, those balls of the ball grid array positioned and configured to carry high-bandwidth data signals or high-frequency clock signals may be located only diagonally adjacent to any other directly adjacent balls configured to carry another of a high-bandwidth data signal or a high-frequency clock signal.

As used herein, the terms "substantially" and "about" in reference to a given parameter, property, or condition mean and include to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

The terms "memory" and "memory device," as used herein, include microelectronic devices exhibiting, but not limited to, memory functionality, but exclude embodiments encompassing transitory signals. For example, a system on a chip (SoC) is encompassed in the meaning of memory device. By way of non-limiting example, memory devices may generally include packaged microelectronic devices having ball grid arrays and signal routing configurations as described herein, unless otherwise specified.

The terms "ball" and "balls," as used in connection with a ball grid array (or other arrayed electrical interconnect) herein, mean and include discrete masses and structures of electrically conductive material positioned and configured to connect a microelectronic device package to other devices, components and structures (e.g., interposer, printed circuit board, etc.) of an electrical system. For example, the term "balls" includes solder balls or bumps, as well as other discrete conductive elements including without limitation (e.g., metal) posts, columns, pillars, studs or other shapes used for the foregoing purpose.

The terms "laterally adjacent" and "longitudinally adjacent," as used herein in connection with balls of a ball grid array, respectively mean and include, when a BGA is parallel to the plane of a drawing sheet, balls located directly to the left of, to the right of, above or below a given ball when geometrical centers of the balls in the ball grid array are at least substantially aligned in a common horizontal or vertical plane. For example, a ball in the ball grid array having balls both laterally and longitudinally adjacent may, in combination, form an at least substantial cross symbol or plus sign within an at least substantially square diamond shape utilizing lines connecting the geometrical centers of the respective balls. Laterally adjacent or longitudinally adjacent balls, pads, or elements may also be referred to as neighboring, contiguous, side-by-side, or next to one another because they may each have a side, edge or point that neighbors, is contiguous to, is side-by-side with, or is next to another ball, pad, or element without any other such element between the two.

The term "diagonally adjacent," as used in connection with a ball grid array herein, means and includes, when a BGA is parallel to the plane of a drawing sheet, balls located directly above and to the right, above and to the left, below and to the right, and below and to the left of a given ball when geometrical centers of the balls in the ball grid array are at least substantially aligned in a common oblique (i.e., diagonal) plane. For example, a ball in the ball grid array having balls diagonally adjacent to that ball in all directions may, in combination, form an at least substantial "X" shape within an at least substantially square shape utilizing lines connecting the geometrical centers of the respective balls. Diagonally adjacent balls, pads, or elements may also be to as neighboring, contiguous, side-by-side, or next to one another because they may each have a point that neighbors, is contiguous to, is side-by-side with, or is next to another ball, pad, or element without any other such element between the two.

The terms "surrounding" and "surrounded" as used in connection with a ball grid array herein, mean and include, when a BGA is parallel to the plane of a drawing sheet, balls located laterally, longitudinally, and diagonally adjacent to a given ball with geometrical centers of the balls in the ball grid array at least substantially aligned respectively with common vertical, horizontal, and diagonal planes. For example, a ball surrounded by other balls in the ball grid array may collectively form a three-by-three matrix of squares utilizing lines connecting the geometrical centers of the respective balls.

The term "high-bandwidth," as used in connection with data signals herein, means and includes data signals capable of transferring data at a Baud rate of about 10 Gigasymbols/s or more. For example, high-bandwidth data signals may be capable of transferring data at Baud rates of between about 15 Gigasymbols/s and about 20 Gigasymbols/s, or potentially higher.

The term "high-frequency," as used in connection with clock signals herein, means and includes clock signals operating at frequencies of about 8 GHz or more. For example, high-frequency clock signals may operate at frequencies of between about 10 GHz and about 45 GHz, or potentially higher.

The illustrations presented in this disclosure are not meant to be actual views of any particular microelectronic device package, ball grid array, or component thereof, but are merely idealized representations employed to describe illustrative embodiments. Thus, the drawings are not necessarily to scale.

Figure 2:
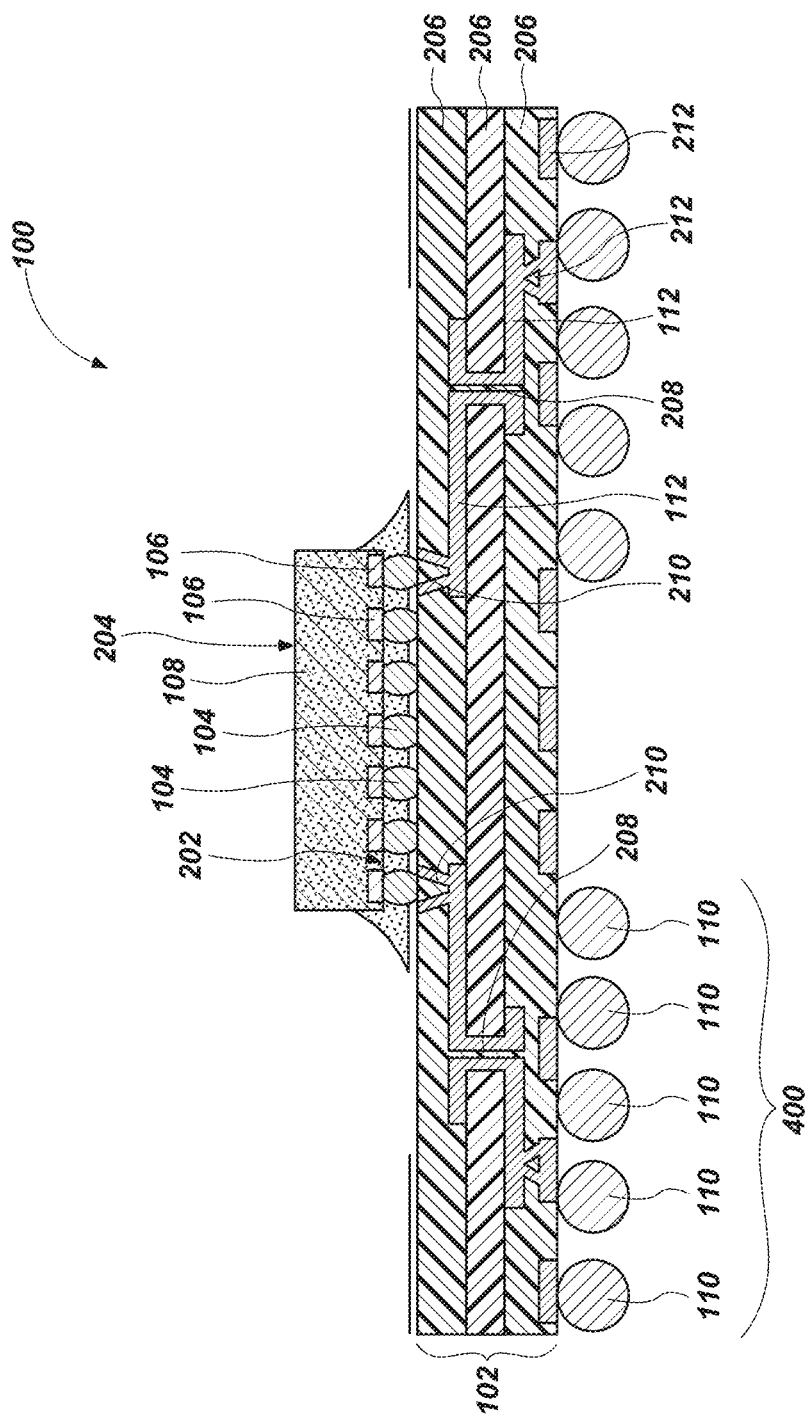
FIG. 2 is a cross-sectional side view of the microelectronic device package of FIG. 1.
Figure 3:
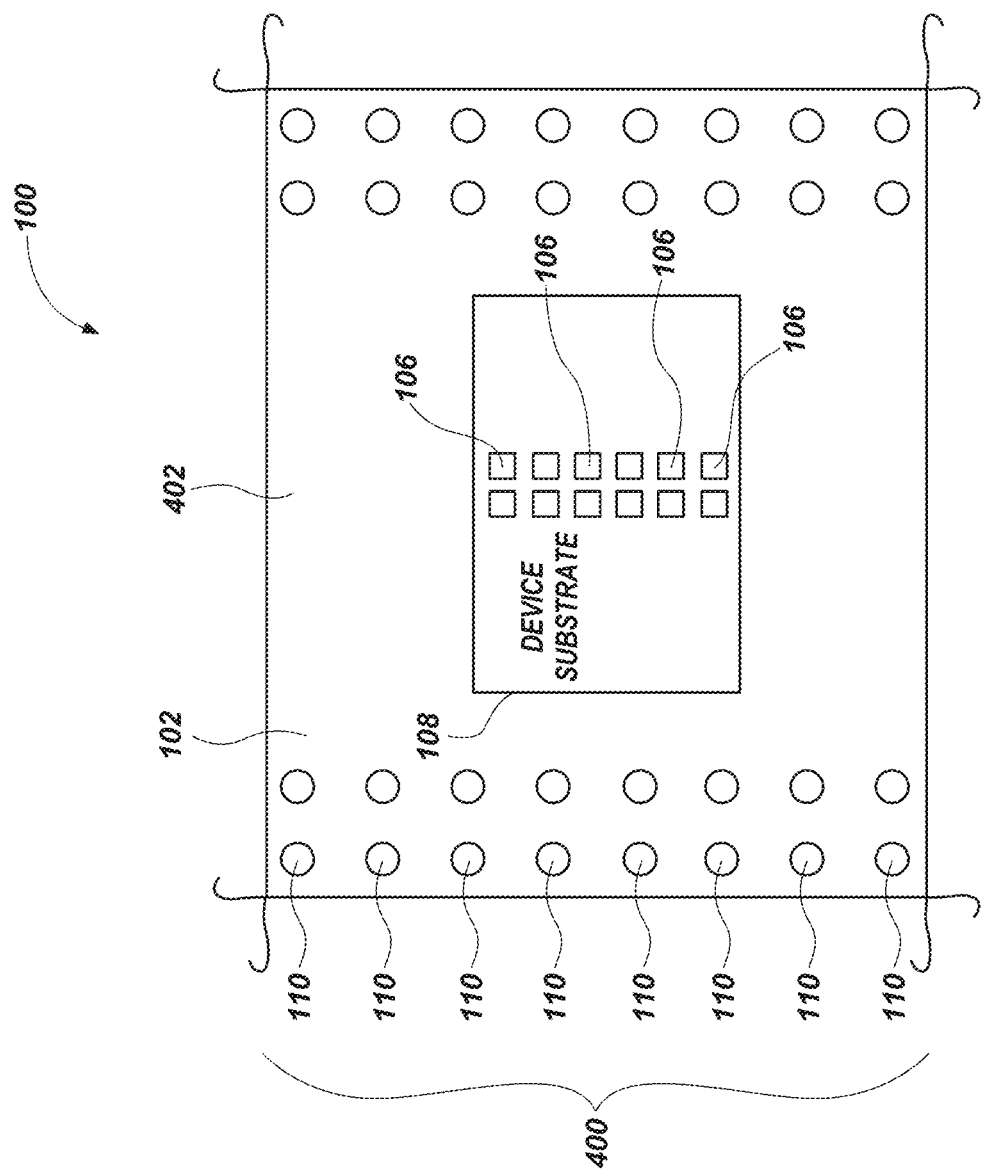
FIG. 3 is a bottom surface view of the microelectronic device package of FIG. 1 with certain components removed so as to more clearly illustrate certain features.

FIG. 1 is a bottom perspective, partially transparent view of a Northwest quadrant of a package substrate 102 of a microelectronic device package 100 including a portion of ball grid array 400 (or other arrayed electrical interconnect) utilizing signal routing techniques in accordance with this disclosure. FIG. 2 is a cross-sectional side view of the microelectronic device package 100 of FIG. 1. FIG. 3 is a bottom surface view of the microelectronic device package 100 of FIG. 1 with certain components removed so as to more clearly illustrate certain features highlighted in the following description.

Referring collectively to FIG. 1 through FIG. 3, the microelectronic device package 100 may include a device substrate 108 (e.g., silicon semiconductor die, other microelectronic device structure). The device substrate 108 may include, for example, a semiconductor material or other microelectronic device structure capable of forming and/or supporting integrated circuitry. More specifically, the device substrate 108 may include an active surface 202 having integrated circuitry embedded therein and/or supported thereon, bond pads 106 on and coupled with the active surface 202 operatively connected to the integrated circuitry and configured to provide input and output connections for the integrated circuitry, and an inactive surface 204 located on a side of the device substrate 108 opposite the active surface 202. As a specific, nonlimiting example, the device substrate 108 may include an active surface 202 having integrated circuitry configured as memory (e.g., Graphics Double Data Rate (GDDR) type 6 or higher Synchronous Dynamic Random-Access Memory (SDRAM)), bond pads 106 forming two rows located at least substantially centrally on, and distal from a lateral periphery of, the active surface 202, and an inactive surface 204 lacking any integrated circuitry located on a side of the device substrate 108 opposite the active surface 202.

The package substrate 102 may generally be configured to route signals to and from the device substrate 108 and to provide more convenient connection configurations when compared to dimensions of the bond pads 106 of the device substrate 108 itself. For example, the package substrate 102 may be configured as a printed circuit board (PCB) or an interposer, or other structure for routing electrical signals to and from the bond pads 106 of the device substrate 108. More specifically, the package substrate 102 may include selectively positioned regions of electrically conductive material and dielectric material, and the electrically conductive material may be operatively connected, and mechanically secured, to the bond pads 106 of the device substrate 108 by conductive elements 104 (e.g., copper pillars) interposed between the package substrate 102 and the device substrate 108. As a specific, nonlimiting example, the package substrate 102 may include input lands 210 of electrically conductive material in contact with the conductive elements 104 (which are, in turn, in contact with the bond pads 106), layers 206 of the dielectric material, vias 208 of electrically conductive material positioned and configured to carry signals from the device substrate 108 received at the input lands 210 longitudinally (i.e., in a direction at least substantially perpendicular to the active surface 202 of the device substrate 108) at least partially through a thickness of the package substrate 102, traces 112 of electrically conductive material positioned and configured to carry signals from the device substrate 108 received at the input lands 210 laterally (i.e., in a direction at least substantially parallel to the active surface 202 of the item device substrate 108) along surfaces of the layers 206 of the dielectric material, and output lands 212 of electrically conductive material located on a side of the package substrate 102 opposite the device substrate 108, the output lands 212 being configured to output signals routed from the input lands 210, through the traces 112 and vias 208 to the output lands 212. Though the traces 112 are depicted in FIG. 1 as extending along the surface of the package substrate 102 on which the BGA 400 is supported, the traces may also or alternatively extend along the surface facing the device substrate and/or within other material of the package substrate 102, such as between layers 206 of dielectric material, as depicted in FIG. 3. Suitable conductive materials for the traces 112, conductive elements 104, and any other electrically conductive structures of the package substrate 102 may include, for example, aluminum, gold, copper, and alloys and combinations thereof. Suitable dielectric materials for the remainder of the package substrate 102, such as the layers 206, may include, for example, dielectric polymer resins.

A ball grid array 400 (or other electrical interconnect comprising discrete conductive elements) may be supported on, and electrically connected to a side of the package substrate 102 opposite the device substrate 108. For example, the ball grid array 400 may include balls 110 of electrically conductive material supported on, and secured to, the output lands 212 of the package substrate 102, and the balls 110 may be distributed in an array forming a repeating, geometric pattern. More specifically, the balls 110 of the ball grid array 400 may be positioned to form a grid of rectangles (e.g., squares) formed by lines interconnecting geometric centers of adjacent balls 110, with the geometric centers of the adjacent balls 110 forming the vertices of the rectangles. As a specific, nonlimiting example, such as in a board on chip (BOC) configuration, the balls 110 of the ball grid array 400 may be distributed in a frame or strips proximate to a periphery of the package substrate 102, with an open area underlying the bond pads 106 of the device substrate 108, with a number of columns and rows of the balls 110 being located within the ring or each strip. A total number of columns of the balls 110 within the ball grid array 400 may be, for example, between about 6 and about 20 (e.g., about 10, about 15). A total number of rows of the balls 110 within the ball grid array 400 may be, for example, between about 10 and about 40 (e.g., about 18, about 20, about 36). The material of the balls 110 may include, for example, solder (e.g., tin/silver solder). In some chip on board (COB) or direct chip attach (DCA) BGA packages, the array of balls 110 may be located on the underside of the package substrate 102 and may bridge a space between the package substrate 102 and a connected device or structure (e.g., a PCB, a chip, another package substrate).

Figure 4:
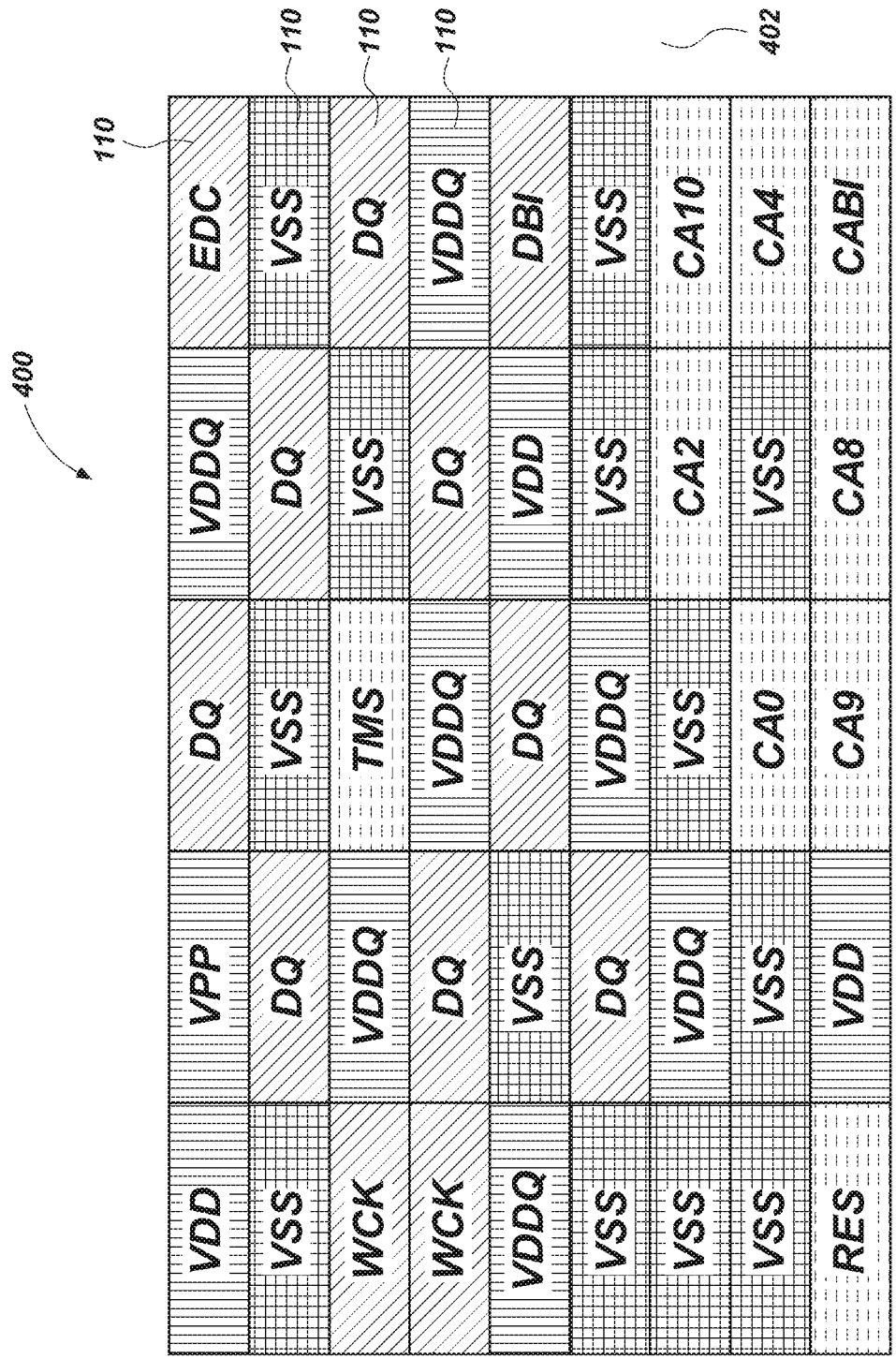
FIG. 4 is a schematic of one quadrant of a ball grid array, including labelling of signals to be carried by the ball grid array, in accordance with this disclosure.

FIG. 4 is a schematic of one (i.e., Northwest) quadrant of a ball grid array 400 (or other arrayed electrical interconnect), including labelling of signals to be carried respectively by balls 110 of the ball grid array 400, in accordance with this disclosure. Each field in the schematic may represent a location of a single ball 110, and an associated signal to be input and/or output via the ball 110, in the ball grid array 400. In implementation, quadrants of ball grid arrays 400 may be stacked vertically in the same layout along a column (i.e., Northwest and Southwest quadrants) and substantially mirrored laterally (i.e., Northeast and Southeast quadrants), with a central gap 402 interposed between adjacent strips of the balls 110. The gap 402 may be positioned under the bond pads 106 (see FIG. 2, FIG. 3).

To reduce crosstalk among the balls 110 of the ball grid array 400, and otherwise improve signal quality, the signals and balls 110 may be distributed such that adjacency, and particularly lateral and longitudinal adjacency, between balls 110 positioned and configured to carry high-bandwidth data signals and high-frequency clock signals may be reduced and/or limited. More specifically, layouts for ball grid arrays 400 and associated signals carried by the balls 110 of the ball grid arrays 400 may reduce, or entirely omit, the occurrence of multiple balls 110 positioned and configured to carry high-bandwidth data signals and high-frequency clock signals that are in sequential adjacency laterally across a row or longitudinally along a column.

For example, each ball 110 of the ball grid array 400 that is positioned and configured to carry one of a high-bandwidth data input/output signal (as labeled "DQ" in FIG. 4) or a high-frequency (write) clock signal (as labeled "WCK" in FIG. 4) may be located laterally or longitudinally adjacent to no more than one other ball 110 of the ball grid array 400 configured to carry another of a high-bandwidth data signal DQ or a high-frequency clock signal WCK. More specifically, each ball 110 of the ball grid array 400 positioned and configured to carry one of a high-bandwidth data signal DQ, a high-frequency clock signal WCK, an error detect code (as labeled "EDC" in FIG. 4), or a data bus inversion (as labeled "DBI" in FIG. 4) is located laterally or longitudinally adjacent to no more than two other balls 110 of the ball grid array 400 configured to carry another of a high-bandwidth data signal DQ, a high-frequency clock signal WCK, an error detect code EDC, or a data bus inversion DBI.

Placing signals of high importance, such as by locating those balls 110 configured to carry a high-bandwidth data signal DQ, a high-frequency clock signal WCK, an error detect code EDC, or a data bus inversion DBI, proximate to the gap 402, and therefore proximate to the device substrate 108 and its bond pads 106, may shorten the distances traveled by those signals, improving their quality and speed. For example, the configuration for the ball grid array 400 shown in FIG. 4 places at least three of the signals of high importance, in particular one of the balls 110 configured to carry a high-bandwidth data signal, the ball 110 configured to carry the error detect code EDC, and the ball 110 configured to carry the data bus inversion DBI, adjacent to the gap 402 while distributing others of the signals of high importance proximate to the gap 402 and spacing those signals to mitigate crosstalk.

In some embodiments, crosstalk among the balls 110 of the ball grid array 400 may be further reduced, and signal quality may be otherwise improved, by distributing the signals and balls 110 such that diagonal adjacency between balls 110 positioned and configured to carry high-bandwidth data signals DQ and high-frequency clock signals WCK, and optionally balls 110 positioned and configured to carry error detect codes EDC and data bus inversions DBI, may be reduced and/or limited. For example, each ball 110 of the ball grid array 400 positioned and configured to carry one of a high-bandwidth data signal DQ or a high-frequency clock signal WCK, and optionally each ball 110 positioned and configured to carry one of an error detect code EDC or a data bus inversion WCK, may have no more than three other balls 110 of the ball grid array 400 configured to carry another of a high-bandwidth data signal DQ or a high-frequency clock signal WCK, and optionally including those other balls 110 configured to carry another of an error detect code EDC or a data bus inversion DBI, in locations surrounding each respective ball 110. More specifically, each ball 110 of the ball grid array 400 positioned and configured to carry one of a high-bandwidth data signal DQ or a high-frequency clock signal WCK, and optionally each ball 110 positioned and configured to carry one of an error detect code EDC or a data bus inversion DBI, may have, for example, no more than two other balls of the ball grid array 400 configured to carry another of a high-bandwidth data signal DQ or a high-frequency clock signal WCK, and optionally including those other balls 110 configured to carry another of an error detect code EDC or a data bus inversion DBI, in locations surrounding each respective ball 110.

In the specific embodiment shown in FIG. 4, the balls 110 positioned and configured to carry the high-frequency clock signals WCK are located in a column on one lateral side of the quadrant of the ball grid array 400 and the balls 110 positioned and configured to carry the error detect code EDC and the data bus inversion BDI are located in another column on an opposite lateral side of the quadrant of the ball grid array 400. The balls 110 positioned and configured to carry the high-bandwidth data signals DQ are distributed diagonally relative to one another and relative to the balls 110 configured to carry the high-frequency clock signals WCK, the error detect code EDC, and the data bus inversion DBI, generally forming a "checkerboard" pattern, but for one ball 110 positioned and configured to carry a high-bandwidth data signal DQ that is located laterally adjacent to one of the balls 110 positioned and configured to carry a high-frequency clock signal WCK. The balls 110 positioned and configured to carry the high-bandwidth data signals DQ are also distributed in columns laterally between those columns in which the balls 110 positioned and configured to carry the high-frequency clock signals WCK, the error detect code EDC, and the data bus inversion DBI are located, but for one ball 110 positioned and configured to carry a high-bandwidth data signal DQ located in the same column as the balls 110 positioned and configured to carry the error detect code EDC and the data bus inversion DBI.

In some embodiments, crosstalk among the balls 110 of the ball grid array 400 may be further reduced, and signal quality may be otherwise improved, by distributing the signals and balls 110 such that adjacency between balls 110 positioned and configured to carry data signals of any bandwidth, and optionally balls 110 positioned and configured to carry clock signals of any frequency, may be reduced and/or limited. For example, each ball 110 of the ball grid array 400 positioned and configured to carry a data signal of any bandwidth (as labeled "DQ" or "CA" (i.e., command address) followed by a numeral in FIG. 4) within a given quadrant may be located laterally or longitudinally adjacent to no more than two other balls 110 of the ball grid array 400 positioned and configured to carry another data signal of any bandwidth within that same quadrant.

In some embodiments, crosstalk among the balls 110 of the ball grid array 400 may be further reduced, signal quality may be otherwise improved, and the foregoing layouts for the balls 110 and associated signals may be enabled by selectively distributing the balls 110 positioned and configured to carry reference voltages, connect to electrical ground, and carry specialty signals other than the error detect code and data bus inversion (e.g., those labeled as "TMS" (i.e., test mode select) "RES" (i.e., reset) in FIG. 4), as well as other encoding signals. For example, a majority of balls 110 of the ball grid array 400 located laterally and longitudinally adjacent to each ball 110 of the ball grid array 400 positioned and configured to carry one of a high-bandwidth data signal DQ or a high-frequency clock signal WCK may themselves be positioned and configured to carry a voltage or ground (labeled as "VDD" (i.e., power) "VSS" (i.e., ground) "VPP" (i.e., programming power or "pump") in FIG. 4). More specifically, a majority of balls 110 of the ball grid array 400 located laterally and longitudinally adjacent to each ball 110 of the ball grid array 400 configured to carry one of a high-bandwidth data signal DQ, a high-frequency clock signal WCK, an error detect code EDC, or a data bus inversion DBI may themselves be positioned and configured to carry, for example, a voltage (VSS, VPP) or ground (VDD), carry a test mode select signal TMS, or carry a reset signal RES.

In some embodiments, a lateral and longitudinal sprawl of the ball grid array 400 may be reduced, and a functional density of the ball grid array 400 may be increased, by keeping the lateral and longitudinal spacing between those balls 110 positioned and configured to carry high-bandwidth data signals DQ and high-frequency clock signals WCK below predetermined maximums. For example, at most two other balls 110 of the ball grid array 400 may be interposed laterally or longitudinally between proximate balls 110 of the ball grid array 400 positioned and configured to carry one of a high-bandwidth data signal DQ or a high-frequency clock signal WCK. More specifically, at most one other ball 110 of the ball grid array 400 may be interposed laterally or longitudinally between balls 110 of the ball grid array 400 positioned and configured to carry one of a high-bandwidth data signal DQ or a high-frequency clock signal WCK that are proximate to one another.

As a specific, nonlimiting embodiment, apparatuses may include a device substrate including a microelectronic device and bond pads proximate to an active surface of the device substrate. A package substrate may be secured to the device substrate, the package substrate configured to route signals to and from the bond pads. A ball grid array may be supported on, and electrically connected to, the package substrate. Each ball of the ball grid array positioned and configured to carry one of a high-bandwidth data signal DQ or a high-frequency clock signal WCK may be located laterally or longitudinally adjacent to no more than one other ball of the ball grid array configured to carry another of a high-bandwidth data signal DQ or a high-frequency clock signal WCK.

Figure 5:
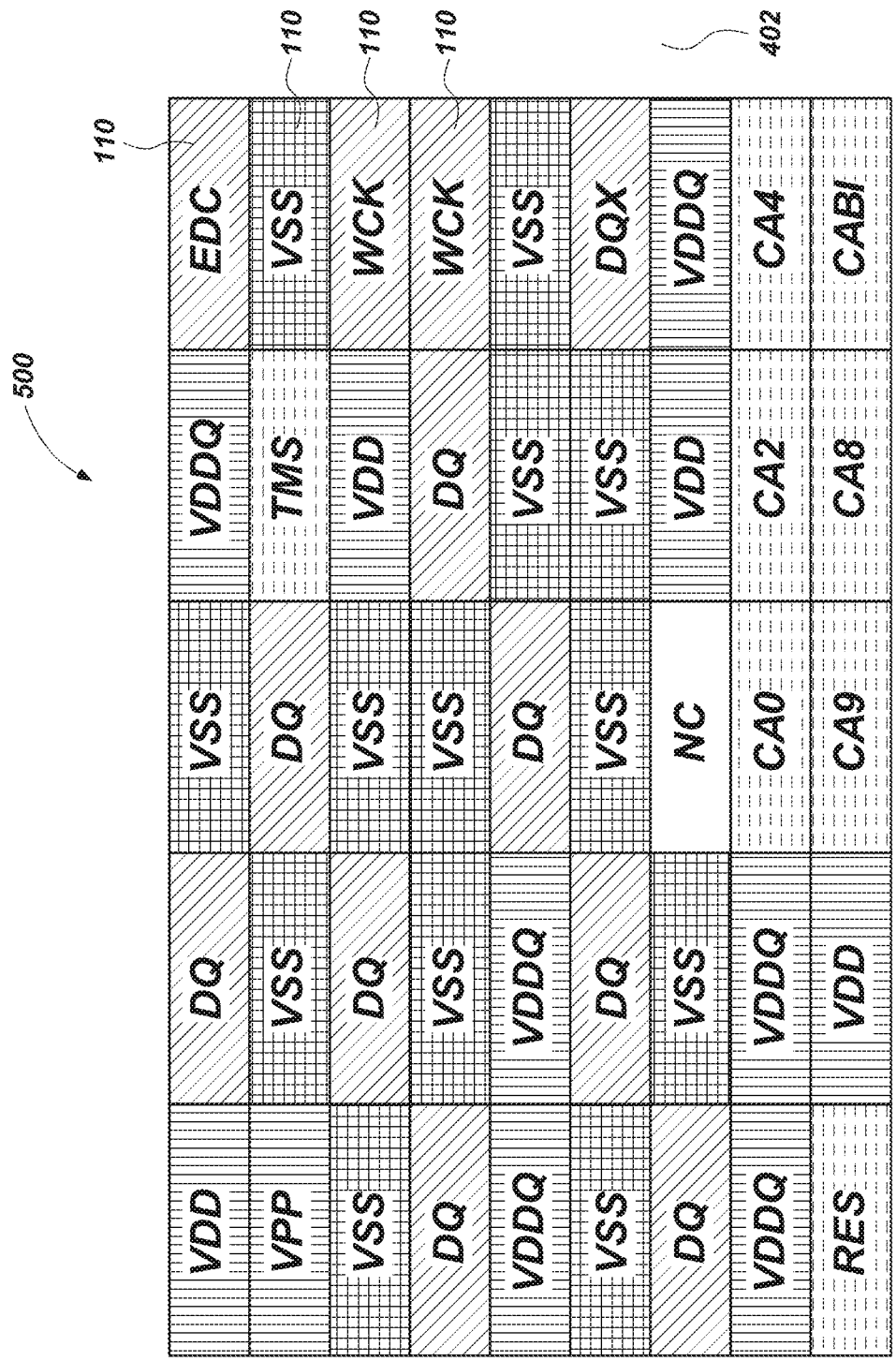
FIG. 5 is a schematic of one quadrant of another ball grid array, including labelling of signals to be carried by the ball grid array.

FIG. 5 is a schematic of one Northwest quadrant of another ball grid array 500 (or other arrayed electrical interconnect), including labelling of signals to be carried by the ball grid array 500. As with FIG. 4, each field in the schematic of FIG. 5 may represent a single ball 110, and an associated signal to be input and/or output via the ball 110, in the ball grid array 500. In implementation, quadrants of ball grid arrays 500 may be stacked vertically in the same layout along a column and substantially mirrored laterally, with a central gap 402 interposed between adjacent strips of the balls 110. The gap 402 may be positioned under the bond pads 106 (see FIG. 2, FIG. 3).

In the specific embodiment shown in FIG. 5, the balls 110 positioned and configured to carry the high-frequency clock signals WCK are located in the same column on one lateral side of the quadrant of the ball grid array 400 as the balls 110 positioned and configured to carry the error detect code EDC, which is depicted in FIG. 5 as being adjacent to the gap 402. The balls 110 positioned and configured to carry the high-bandwidth data signals DQ are distributed diagonally relative to one another and relative to the balls 110 configured to carry the high-frequency clock signals WCK, but for one ball 110 positioned and configured to carry a high-bandwidth data signal DQ that is located laterally adjacent to one of the balls 110 positioned and configured to carry a high-frequency clock signal WCK. The ball 110 positioned and configured to carry the error detect code EDC may be isolated from the balls 110 positioned and configured to carry the high-frequency clock signals WCK and the high-bandwidth data signals DQ, such that the ball 110 positioned and configured to carry the error detect code EDC may not be adjacent to any of the balls 110 positioned and configured to carry the high-frequency clock signals WCK and the high-bandwidth data signals DQ. The balls 110 positioned and configured to carry the high-bandwidth data signals DQ are also distributed in columns laterally closer to the periphery of the package substrate 102 than the column in which the balls 110 positioned and configured to carry the high-frequency clock signals WCK, and the error detect code EDC, are located.

Figure 6:
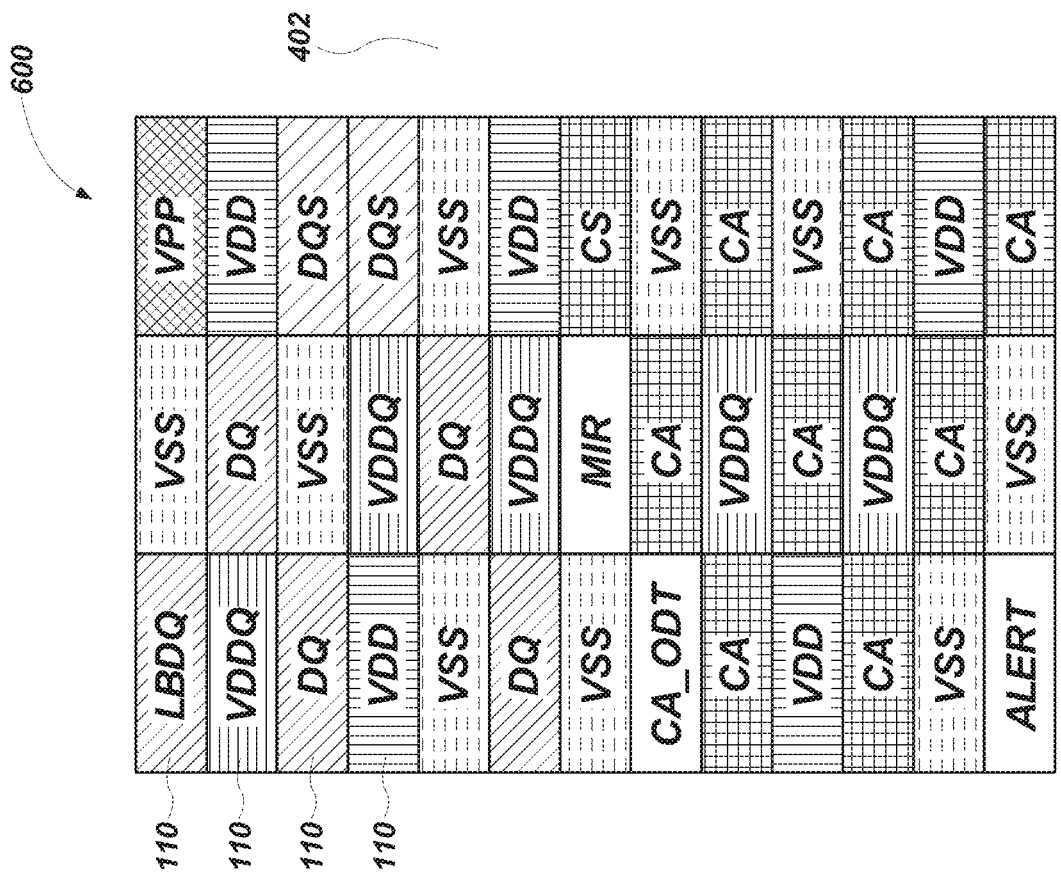
FIG. 6 is a schematic of one quadrant of another ball grid array, including labelling of signals to be carried by the ball grid array.

FIG. 6 is a schematic of one quadrant (e.g., Northwest) of another ball grid array 600 (or other electrical interconnect comprising discrete conductive elements), including labelling of signals to be carried by the ball grid array 600. As with FIG. 4 and FIG. 5, each field in the schematic of FIG. 6 may represent a single ball 110, and an associated signal to be input and/or output via the ball 110, in the ball grid array 600. In implementation, the quadrant of the ball grid array 600 may be stacked vertically in the same layout along a column (i.e., Northwest and Southwest quadrants) and substantially mirrored laterally (i.e., Northeast and Southeast quadrants), with a central gap 402 interposed between adjacent strips of the balls 110. The gap 402 may be positioned over the bond pads 106 (see FIG. 2, FIG. 3).

As another example of reducing crosstalk among the balls 110 of the ball grid array 600, and otherwise improving signal quality, each ball 110 of the ball grid array 600 positioned and configured to carry a high-bandwidth data signal (as labeled "DQ," "LBDQ" in FIG. 6) may be located, for example, laterally or longitudinally adjacent to no other ball 110 of the ball grid array 600 configured to carry another of a high-bandwidth data signal or a high-frequency clock signal (as labeled "DQS" in FIG. 6). More specifically, each ball 110 of the ball grid array 600 positioned and configured to carry a high-bandwidth data signal may be located only diagonally adjacent to any other directly adjacent balls 110 configured to carry another of a high-bandwidth data signal or a high-frequency clock signal. In other words, there may not be more than two diagonally adjacent high bandwidth data signal aggressors (DQ, etc.), as indicated within broken lines at the upper left-hand portion of FIG. 6. Similarly, there may not be more than three or four diagonally adjacent command address CA aggressors, as indicated within broken lines at the lower left-hand portion of FIG. 6.

In some embodiments, each ball 110 of the ball grid array 600 positioned and configured to carry one of a high-bandwidth data signal or a high-frequency clock signal may be located diagonally adjacent to no more than two other directly adjacent balls 110 of the ball grid array 600 positioned and configured to carry another of a high-bandwidth data signal or a high-frequency clock signal. For example, a majority of the balls 110 of the ball grid array 600 positioned and configured to carry one of a high-bandwidth data signal or a high-frequency clock signal may be located diagonally adjacent to exactly two other balls 110 of the ball grid array 600 positioned and configured to carry another of a high-bandwidth data signal or a high-frequency clock signal.

In some embodiments, each ball 110 of the ball grid array 600 positioned and configured to carry one of a high-bandwidth data signal or a high-frequency clock signal may have no more than two other balls 110 of the ball grid array 600 configured to carry another of a high-bandwidth data signal or a high-frequency clock signal in locations surrounding each respective ball 110. For example, each ball 110 of the ball grid array 600 positioned and configured to carry one of a high-bandwidth data signal or a high-frequency clock signal may have one or two other balls 110 of the ball grid array 600 configured to carry another of a high-bandwidth data signal or a high-frequency clock signal in locations surrounding the respective ball 110.

In some embodiments, each ball 110 of the ball grid array 600 positioned and configured to carry a data signal of any bandwidth (labeled as "DQ," "LBDQ," "LBDQS," "CA," in FIG. 6) may be located laterally or longitudinally adjacent to no more than one other ball 110 of the ball grid array 600 configured to carry another data signal of any bandwidth. For example, each ball 110 of the ball grid array 600 positioned and configured to carry a data signal of any bandwidth may be located laterally or longitudinally adjacent to no other balls 110 of the ball grid array 600 configured to carry another data signal of any bandwidth.

In the specific embodiment shown in FIG. 6, the balls 110 positioned and configured to carry the high-frequency clock signals DQS are located longitudinally adjacent to one another in the same column on one lateral side of the quadrant of the ball grid array 400, which is depicted in FIG. 6 as being adjacent to the gap 402. The balls 110 positioned and configured to carry the high-bandwidth data signals (as labeled "DQ," "LBDQ" in FIG. 6) are distributed diagonally relative to one another and relative to the balls 110 positioned and configured to carry the high-frequency clock signals DQS in other columns distal from the gap 402.

In some embodiments, each ball 110 of the ball grid array 600 located laterally and longitudinally adjacent to each ball 110 of the ball grid array 600 configured to carry a high-bandwidth data signal may be configured to carry a voltage, connect to electrical ground, or carry a low-bandwidth data signal. For example, each ball 110 of the ball grid array 600 located laterally and longitudinally adjacent to each ball 110 of the ball grid array configured to carry a high-bandwidth data signal may be configured to carry a voltage, connect to electrical ground, or carry a low-bandwidth data signal.

In some embodiments, at most two other balls 110 of the ball grid array 600 may be interposed laterally or longitudinally between adjacent balls 110 of the ball grid array 600 positioned and configured to carry one of a high-bandwidth data signal or a high-frequency clock signal. For example, only one other ball 110 of the ball grid array 600 may be interposed laterally or longitudinally between balls 110 of the ball grid array 600 positioned and configured to carry one of a high-bandwidth data signal or a high-frequency clock signal that are proximate to one another.

As a specific, nonlimiting embodiment, apparatuses may include a device substrate including a microelectronic device and bond pads proximate to an active surface of the device substrate. A package substrate may be secured to the device substrate, the package substrate configured to route signals to and from the bond pads. A ball grid array may be supported on, and electrically connected to, the package substrate. Each ball of the ball grid array positioned and configured to carry a high-bandwidth data signal may be located only diagonally adjacent to any other directly adjacent balls configured to carry another of a high-bandwidth data signal or a high-frequency clock signal.

Figure 7:
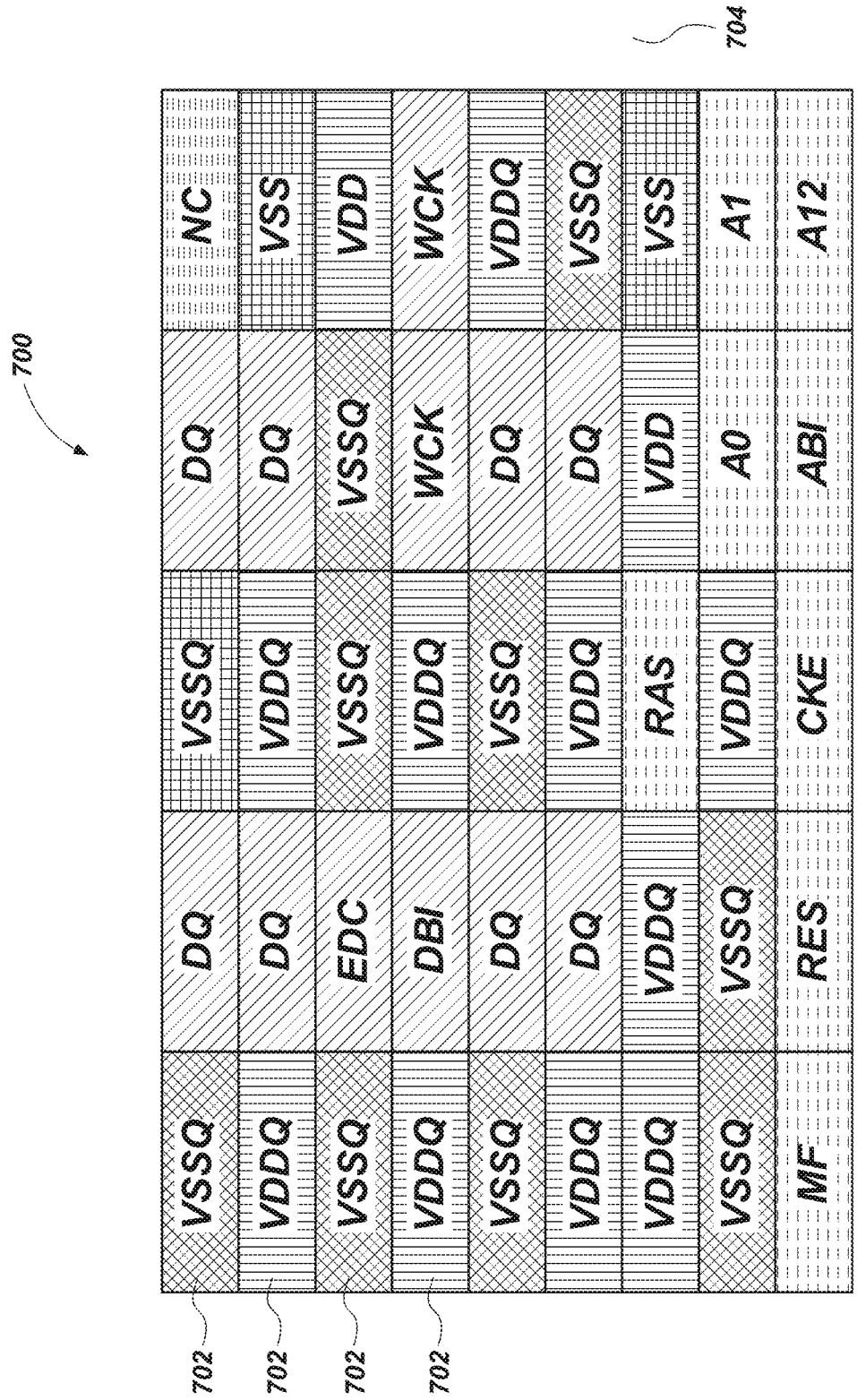
FIG. 7 is a schematic of one quadrant of a conventional ball grid array known to the inventors, including labelling of signals to be carried by the ball grid array.

FIG. 7 is a schematic of one Northwest quadrant of an example ball grid array 700 known to the inventors, including labelling of signals to be carried by the ball grid array 700. As shown in FIG. 7, the balls 702 positioned and configured to carry the high-bandwidth data signals (labeled as "DQ" in FIG. 7) and the high-frequency clock signals (labeled as "WCK" in FIG. 7) are positioned adjacent to one another and concentrated in two columns of the ball grid array 700. More specifically, the balls 702 positioned and configured to carry the high-bandwidth data signals DQ, the high-frequency clock signals WCK, the error detect code EDC, and the data bus inversion DBI are positioned longitudinally adjacent to one another in sequences along two of the columns of the ball grid array 700. One of the balls 702 positioned and configured to carry one of the high-frequency clock signals WCK may be located adjacent to the gap 704.

FIG. 8 is a schematic of one half (e.g., a North, top half) of another example ball grid array 800 known to the inventors, including labelling of signals to be carried by the ball grid array 800. As shown in FIG. 8, at least some of the balls 802 positioned and configured to carry the high-bandwidth data signals (labeled as "DQ," "LBDQ," "LBDQS" in FIG. 8) and the high-frequency clock signals (labeled as "DQS," "TDQS," "DM/TDQS" in FIG. 8) are positioned adjacent to one another and in one of the columns of the ball grid array 800. More specifically, balls 802 positioned and configured to carry some of the high-bandwidth data signals and some of the high-frequency clock signals are positioned longitudinally adjacent to one another in sequence along the column of the ball grid array 800 proximate to the gap 804. As a result, there is strong coupling between strobes (clock) and data balls as indicated within broken lines at the upper left-hand portion of FIG. 8. Similarly, there is strong coupling among the command address balls as indicated within broken lines at the lower left-hand portion of FIG. 8.

Figure 9:
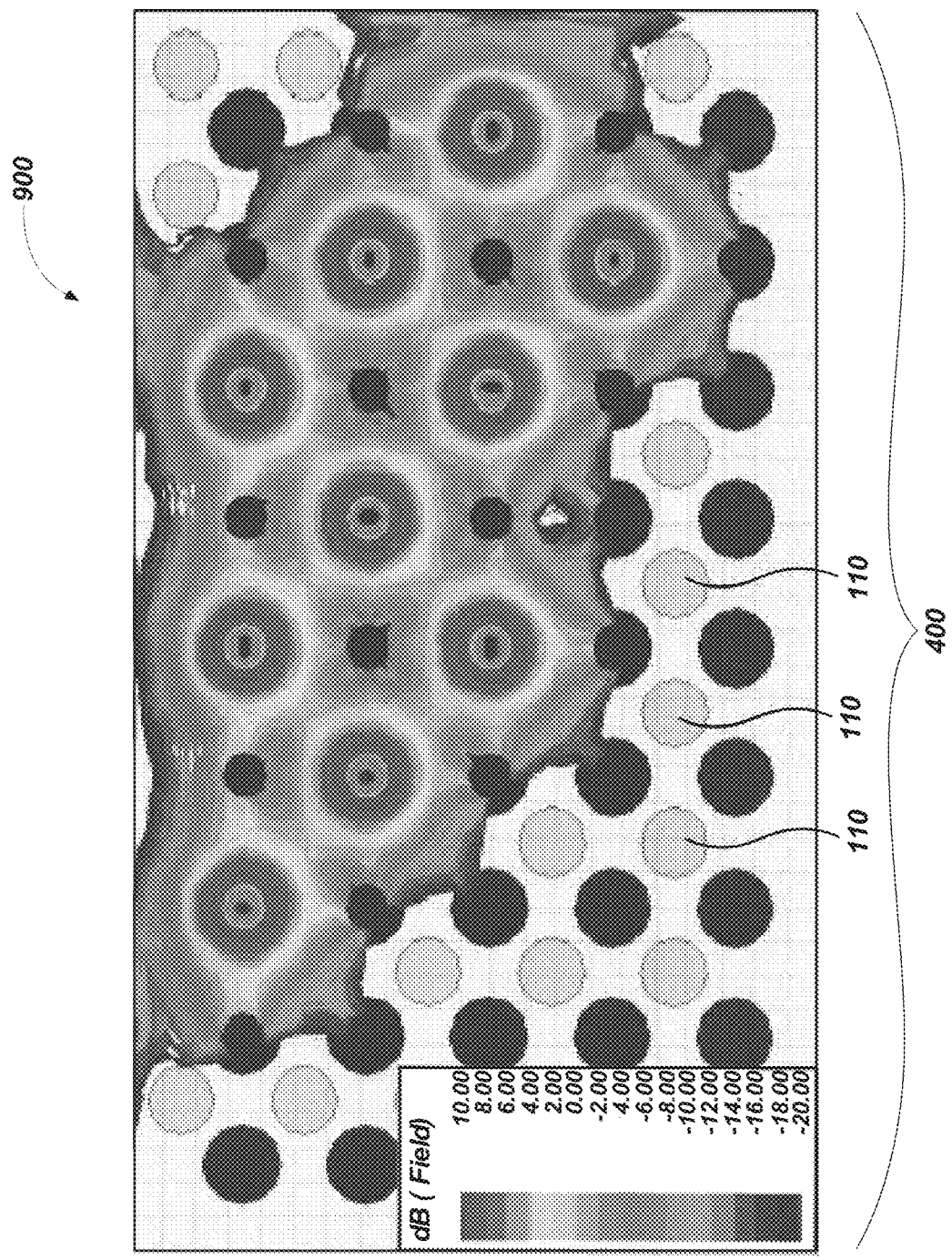
FIG. 9 is a map of an intensity of magnetic fields generated by a ball grid array in accordance with this disclosure.

FIG. 9 is a map 900 of an intensity of magnetic fields generated by a 3D electromagnetic field solver to predict magnetic fields of a portion of a ball grid array 400 (or other arrayed electrical interconnect) having high-intensity balls 110 generally in a checkerboard pattern in accordance with this disclosure, other balls 110 (e.g., reference voltage or ground) interspersed between and separating to substantially isolated the individual magnetic fields of laterally and longitudinally adjacent high-intensity balls 110.

Figure 10:
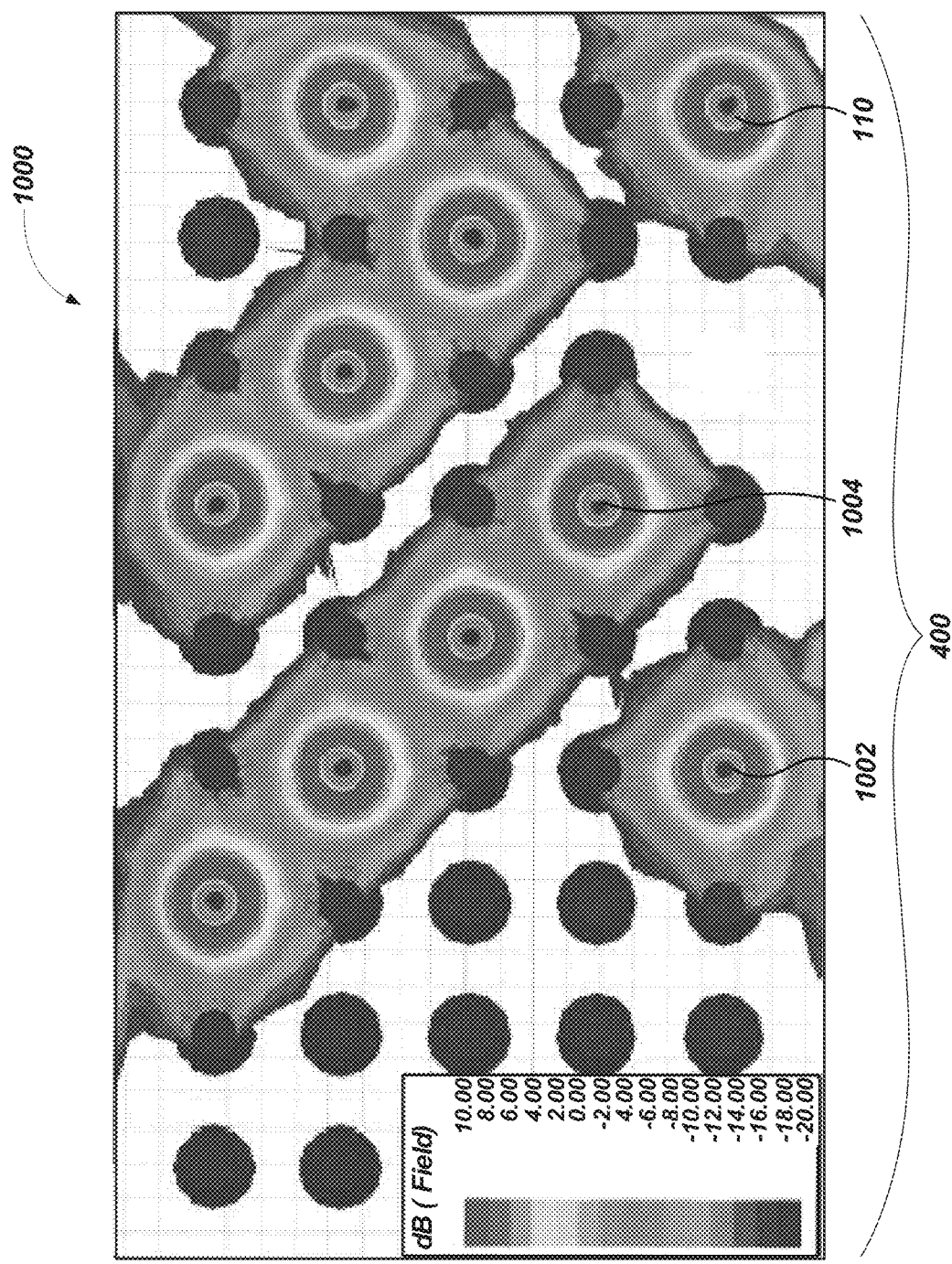
FIG. 10 is another map of an intensity of magnetic fields generated by a ball grid array in accordance with this disclosure.

FIG. 10 is another map 1000 of an intensity of magnetic fields generated by another portion of a ball grid array 500 (or other arrayed electrical interconnect) having high-intensity balls 110 generally in a diagonal pattern in accordance with this disclosure, the diagonal spacing of directly adjacent high-intensity balls 110 being greater than if the high-intensity balls 110 were directly laterally or longitudinally mutually adjacent, separating and isolating the individual magnetic fields. The differences between regions of intensity shown in FIG. 9 and FIG. 10 are graphed on a logarithmic scale, such that a line between each region demarcates an order of magnitude change in intensity. By spacing out at least the balls 110 positioned and configured to carry the high-bandwidth data signals and the high-frequency clock signals, the maximum intensity of the magnetic field produced by electrical signals flowing through, and carried by, the respective balls 110 may decrease in locations among the balls 110 themselves, such that crosstalk between the balls 110 is reduced. As shown in each of FIG. 9 and FIG. 10, the intensity of the magnetic field is strongest proximate to the balls 110 themselves, and spacing the balls 110 as disclosed herein may ensure that the magnetic field has space to substantially dissipate in the regions between the balls 110. For example, the intensity of the magnetic field between adjacent balls 110 of the ball grid arrays 400, 500 may reach a minimum of about 100 times less than a maximum intensity of the magnetic field, or less, when in use. More specifically, the intensity of the magnetic field between adjacent balls 110 of the ball grid arrays 400, 500 may reach a minimum of between about 10 times and about 100 times (e.g., 25 times, 50 times, 75 times) less than a maximum intensity of the magnetic field, when in use. Those balls 110 positioned between the balls 110 producing strong magnetic fields, such as those positioned and configured to carry a reference voltage and/or connect to electrical ground, may provide a sink for the magnetic fields produced by the other balls 110, further reducing crosstalk among the balls 110 positioned and configured to carry one of a high-bandwidth data signal or a high-frequency clock signal.

Figure 11:
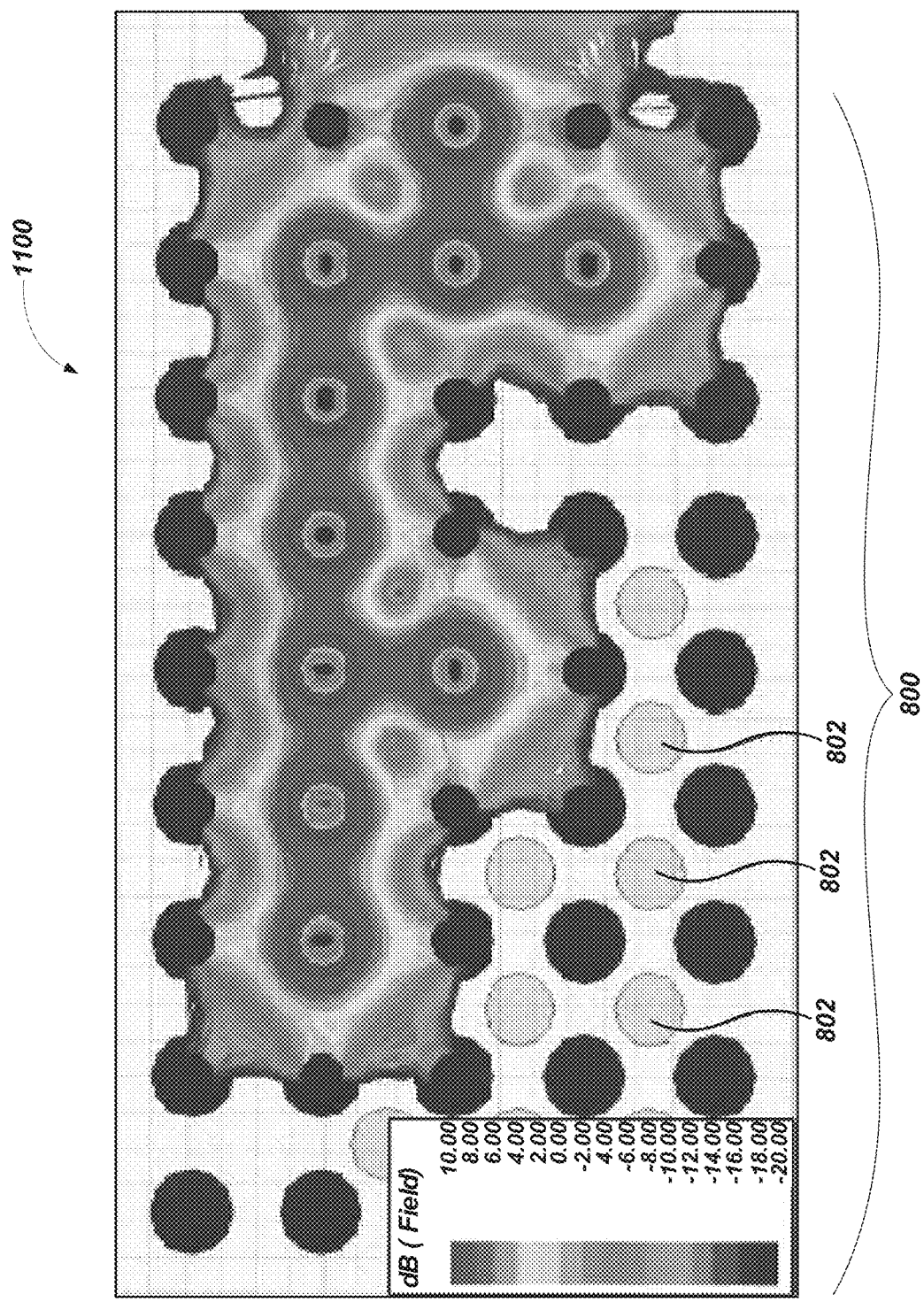
FIG. 11 is another map of an intensity of magnetic fields generated by a conventional ball grid array known to the inventors.

FIG. 11 is another map 1100 of an intensity of magnetic fields generated by an example ball grid array 800 depicted in FIG. 8, known to the inventors and having high-intensity balls 802 generally in a sequential, linear pattern. When the balls 802 positioned and configured to carry high-bandwidth data signals and/or high-frequency clock signals are positioned laterally and/or longitudinally adjacent to one another, particularly in sequences of more than two balls 802, the magnetic fields generated thereby may overlap in such a way that crosstalk among the balls 802 occurs. For example, the magnetic fields produced may have inadequate space to dissipate, and may overlap and combine in the regions among adjacent balls 802. The presence of overlapping, intense magnetic fields may induce flow of electricity within the balls 802 other than the intended flow, producing crosstalk and reducing signal quality. By way of comparison, signal ball coupling in comparison to that shown in FIG. 11 is reduced by a factor of four as shown in FIG. 9 and reduces to near zero as shown in FIG. 10.

Figure 12:
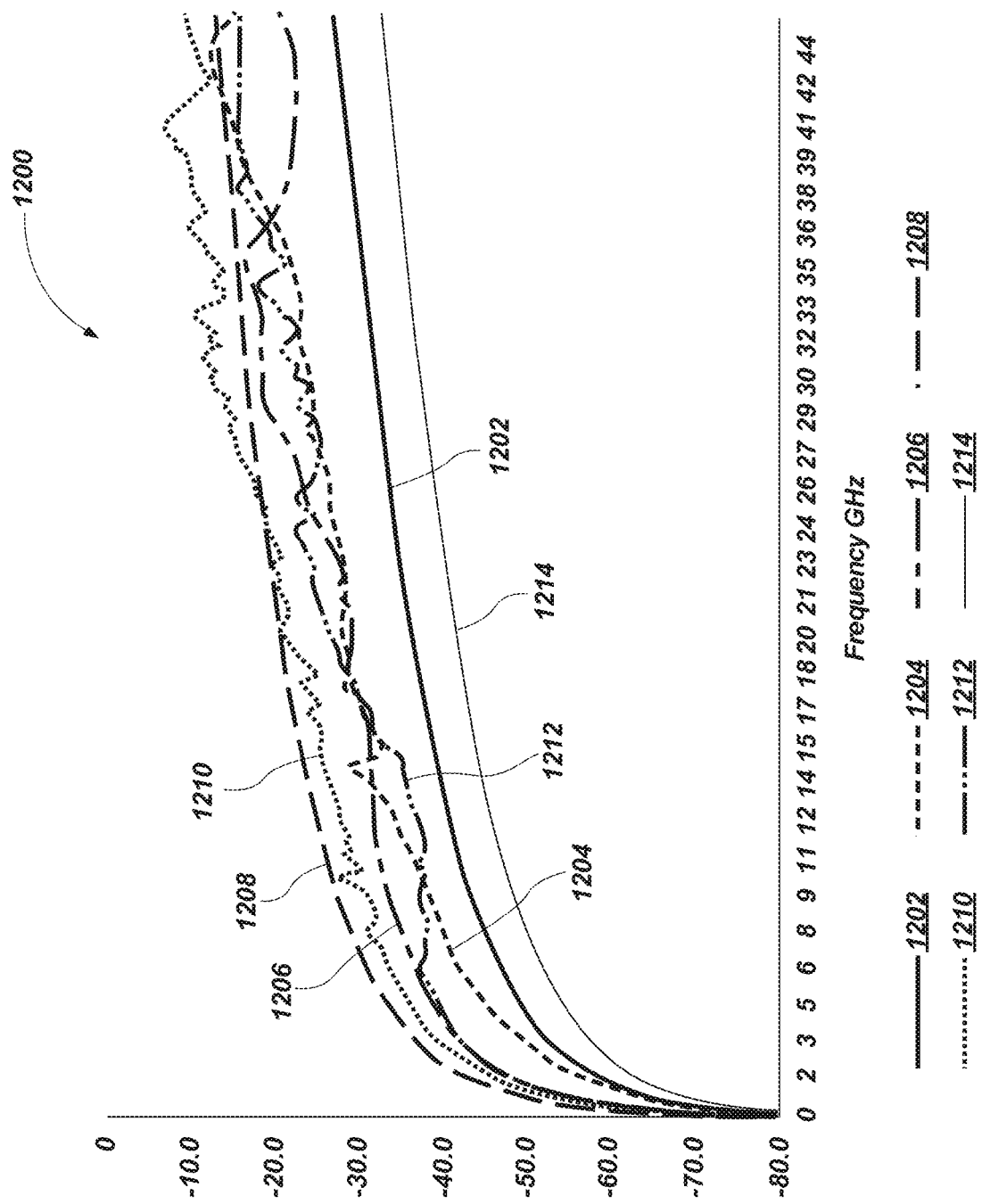
FIG. 12 is a graph of crosstalk among various components of a microelectronic device package in accordance with this disclosure.

FIG. 12 is a graph 1200 of crosstalk among various components of a microelectronic device package in accordance with this disclosure. The Y-axis represents power, and the X-axis represents the frequency of signals in GHz. The lines were generated by identifying a ball in the ball grid array exhibiting the worst crosstalk, and the highest power crosstalk for that ball was charted on the Y-axis for various frequencies. Lower power for the maximum crosstalk means that less cross talk was experienced, and high signal quality was preserved, by the respective component. The lines 1202 and 1214 depict the crosstalk among the balls of two designs for ball grid arrays (or other arrayed electrical interconnects) in accordance with this disclosure. Specifically, the line 1202 depicts the crosstalk among balls where the balls positioned and configured to carry the high-bandwidth data signals and/or high-frequency clock signals are generally arranged in a checkerboard pattern corresponding to FIG. 9. The line labeled 1214 depicts the crosstalk among balls where the balls positioned and configured to carry the high-bandwidth data signals and/or high-frequency clock signals are generally arranged in a parallel diagonal lines corresponding to FIG. 10. The line labeled 1204 depicts the crosstalk among the conductive structures of a PCB breakout to which the ball grid array for line 1202 is connected, and the line labeled 1206 depicts the crosstalk among the traces of the microelectronic device package. The line 1208 depicts the crosstalk among the balls of a conventional design for ball grid arrays known to the inventors. The line labeled 1210 depicts the crosstalk among the conductive structures of a PCB breakout to which the ball grid array for line 1208 is connected, and the line labeled 1212 depicts the crosstalk among the traces of the microelectronic device package.

As shown in FIG. 12, the designs for ball grid arrays (or other arrayed electrical interconnects) in accordance with this disclosure exhibited lower crosstalk in the form of signal returns than the example design known to the inventors. In addition, the designs for ball grid arrays in accordance with this disclosure contributed the least to total crosstalk for their respective microelectronic device packages. In other words, the ball grid arrays in accordance with this disclosure had the lowest-power crosstalk of all components of the microelectronic device packages analyzed. By contrast, the conventional design for a ball grid array known to the inventors exhibited the highest or second-highest crosstalk in the form of signal returns, and contributed the most to total crosstalk in its package, across an overwhelming majority of clock frequencies. In other words, the designs for ball grid arrays disclosed herein reduced crosstalk attributable to the ball grid array itself from the highest-crosstalk component to the lowest-crosstalk component in the package. More specifically, the designs for ball grid arrays disclosed herein exhibited a reduction in crosstalk of between about 15 dB and about 20 dB when operating at high-frequency clock speeds.

Figure 13:
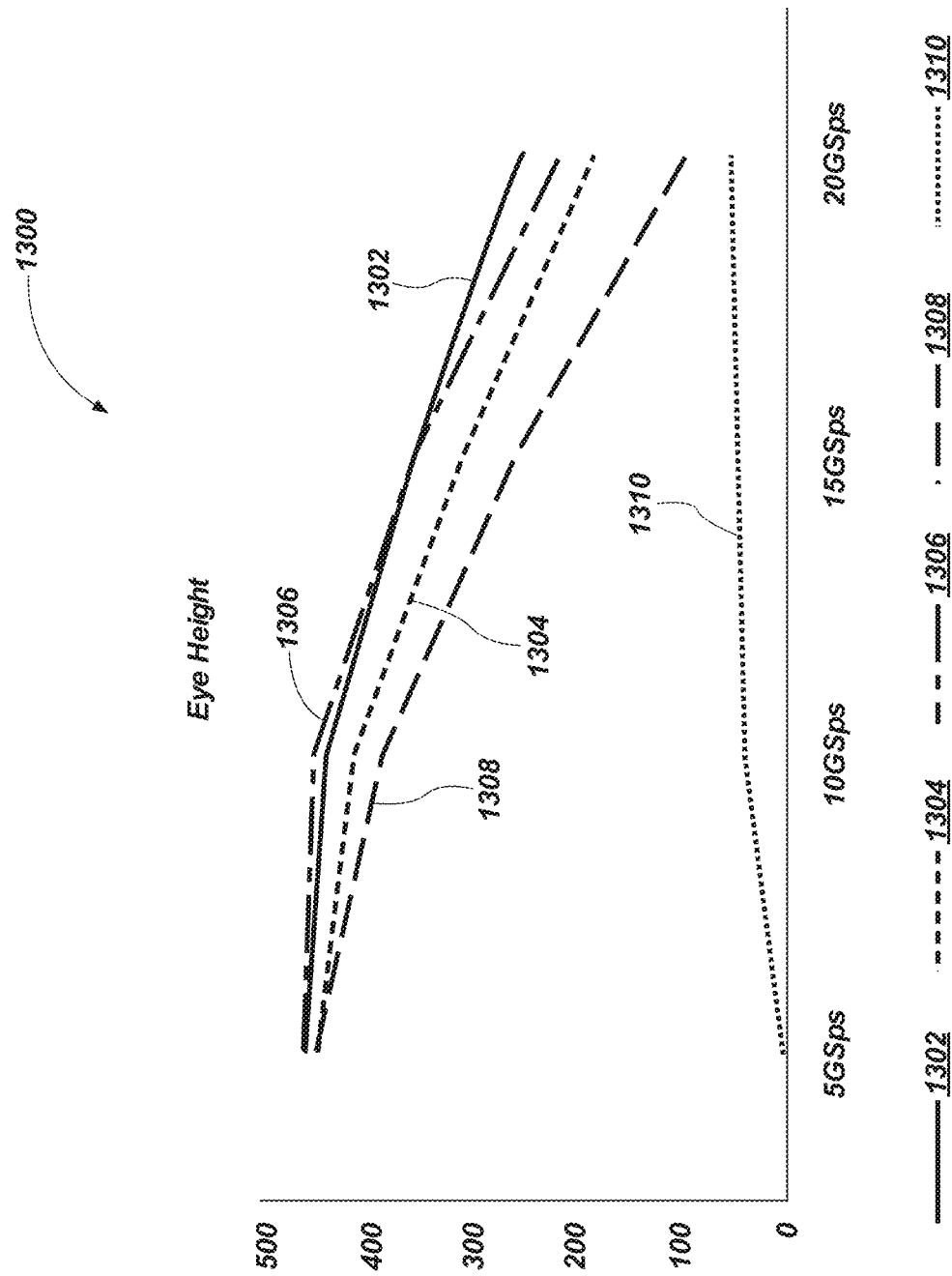
FIG. 13 is a graph of an eye height of a data signal carried by balls of various ball grid arrays discussed herein.

FIG. 13 is a graph 1300 of an eye height of a data signal carried by balls of various ball grid arrays (or other arrayed electrical interconnects) discussed herein. The Y-axis represents eye height in mV, and the X-axis represents the bandwidth of the data signal, as measured in Gigasymbols/s. Generally, having a larger eye makes detecting a change in the signal easier to detect and is emblematic of high quality signal transmission, whereas noisy, low quality signals will produce smaller eyes. Lines 1302 and 1304 depict the eye heights for data signals carried by two different designs for ball grid arrays in accordance with this disclosure. Specifically, the line 1302 depicts the eye height for data signals carried by a ball grid array where the balls positioned and configured to carry the high-bandwidth data signals and/or high-frequency clock signals are generally arranged in a checkerboard pattern corresponding to FIG. 9. The line labeled 1304 depicts the eye height for data signals carried by a ball grid array where the balls positioned and configured to carry the high-bandwidth data signals and/or high-frequency clock signals are generally arranged in a parallel diagonal lines corresponding to FIG. 10. Lines 1306 and 1308 depict the eye heights for data signals carried by two example designs for ball grid arrays known to the inventors. Line 1310 depicts the difference in eye height between line 1304 and line 1308.

As reflected in FIG. 13, the designs for ball grid arrays (or other arrayed electrical interconnects) in accordance with this disclosure maintained larger eye heights in oscillating signals than the conventional designs known to the inventors across all bandwidths. The difference in eye height was most pronounced at high bandwidths, as shown at line 1310. For example, an eye height of high-bandwidth data signals up to about 20 Gigasymbols/s carried by each ball of the ball grid array positioned and configured to carry the high-bandwidth data signals may be at least 100 mV. More specifically, the eye height of high-bandwidth data signals between about 10 Gigasymbols/s and about 20 Gigasymbols/s carried by each ball of the ball grid array positioned and configured to carry the high-bandwidth data signals may be between about 100 mV and about 500 mV. As a specific, nonlimiting example, the eye height of high-bandwidth data signals between about 15 Gigasymbols/s and about 20 Gigasymbols/s carried by each ball of the ball grid array positioned and configured to carry the high-bandwidth data signals may be between about 100 mV and about 400 mV (e.g., about 250 mV, about 300 mV, about 350 mV).

Figure 14:
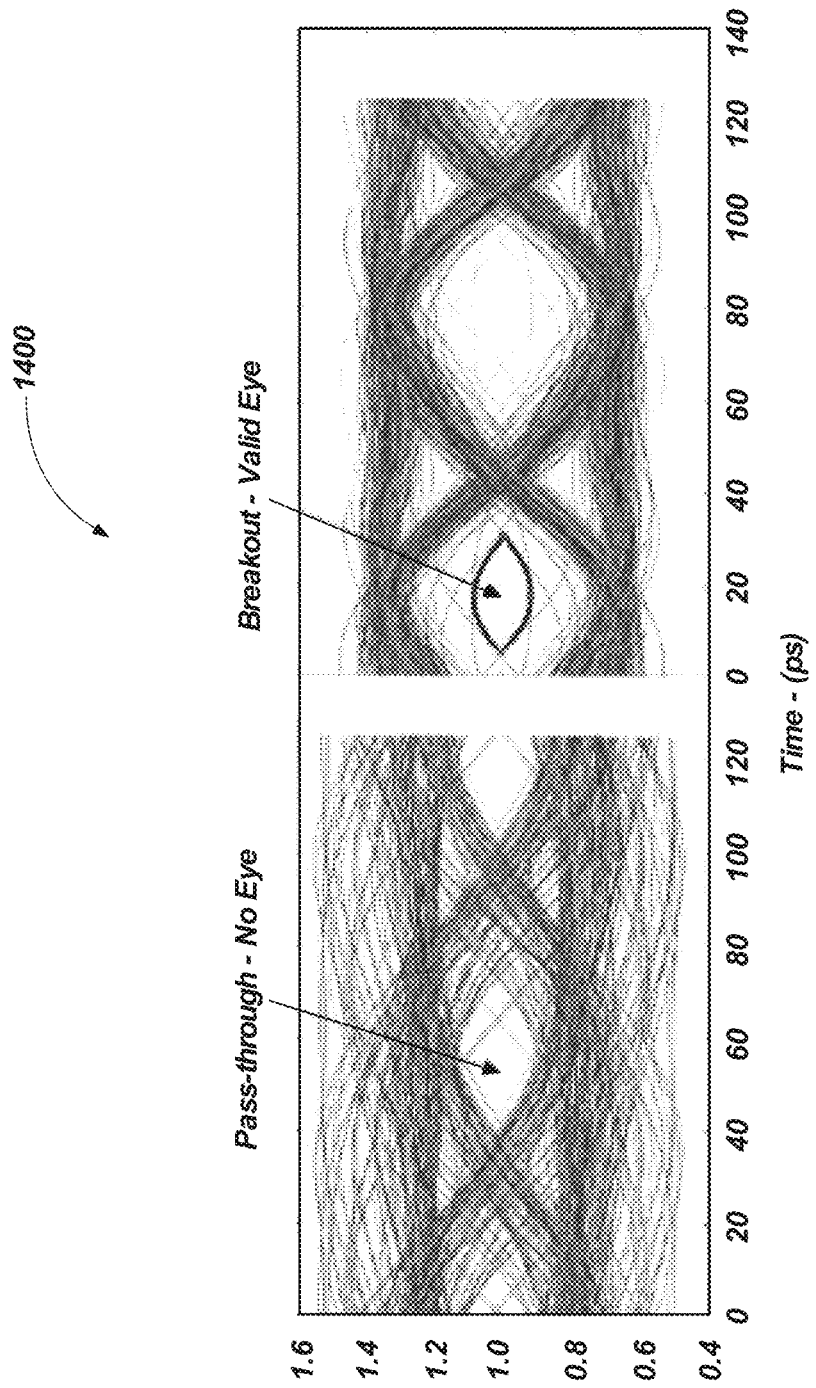
FIG. 14 is a graph of simulated performance of a ball grid array in accordance with this disclosure and a conventional ball grid array known to the inventors.

FIG. 14 is a graph 1400 of simulated performance of a ball grid array (or other arrayed electrical interconnect) in accordance with this disclosure and an example ball grid array known to the inventors. The Y-axis depicts the oscillating data signal's voltage, and the X-axis depicts time in picoseconds. The simulated performance of the ball grid array in accordance with this disclosure at a bandwidth of 16 Gigasymbols/s is shown on the right, and the simulated performance of the example ball grid array known to the inventors at a bandwidth of 16 Gigasymbols/s is shown on the left. As shown in FIG. 14, the ball grid array in accordance with this disclosure produces a valid open eye (i.e., breakout) indicative of high signal quality and fidelity. By contrast, the conventional ball grid array known to the inventors produces a closed eye when operating at this high bandwidth. Such maintenance of a valid eye may be particularly important, and crosstalk may be particularly difficult to mitigate, when working with multilevel signal modulation formats. For example, ball grid arrays in accordance with this disclosure may mitigate crosstalk, and maintain signal quality, when used in connection with pulse amplitude modulation level 4 (PAM4) signal formatting.

Embodiments of ball grid arrays disclosed herein and related signal routing between the ball grid arrays and associated microelectronic devices, may reduce crosstalk and improve signal quality, particularly at high bandwidths and clock speeds.

Figure 15:
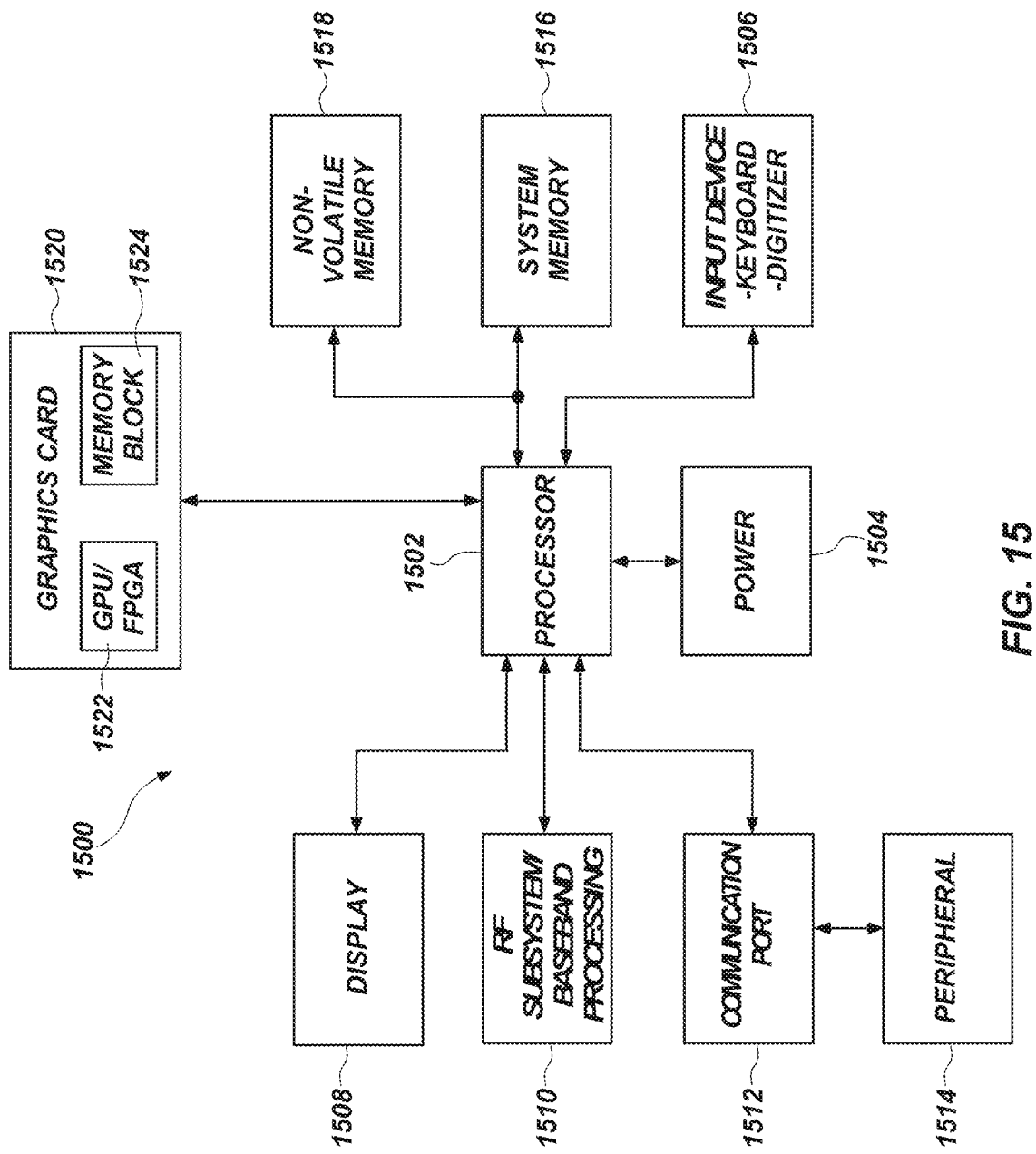
FIG. 15 is a block diagram of an electronic system incorporating memory configured as BGA packages in accordance with embodiments of the disclosure.

FIG. 15 is a block diagram of an electronic system 1500 incorporating memory 1516, 1518 configured as BGA packages in accordance with embodiments of the disclosure. The electronic system 1500 may include various microelectronic devices manufactured in accordance with embodiments of the present disclosure. For example, the electronic system 1500 may be any of a variety of types, such as a computer, tablet, cellular phone, smartphone, control circuit, or other electronic device. The electronic system 1500 may include one or more processors 1502, such as a microprocessor, to control the processing of system functions and requests in the electronic system 1500.

The electronic system 1500 may include a power supply 1504 in operable communication with the processor 1502. For example, if the electronic system 1500 is a portable system, the power supply 1504 may include one or more of a fuel cell, a power scavenging device, permanent batteries, replaceable batteries, and/or rechargeable batteries. The power supply 1504 may also include an AC adapter; therefore, the electronic system 1500 may be plugged into a wall outlet, for example. The power supply 1504 may also include a DC adapter such that the electronic system 1500 may be plugged into a vehicle cigarette lighter or a vehicle power port, for example.

Various other devices may be coupled to the processor 1502 depending on the functions that the electronic system 1500 performs. For example, a user interface 1506 may be coupled to the processor 1502. The user interface 1506 may include input devices such as buttons, switches, a keyboard, a light pen, a mouse, a digitizer and stylus, a touch screen, a voice recognition system, a microphone, or a combination thereof. A display 1508 may also be coupled to the processor 1502. The display 1508 may include an LCD display, an SED display, a CRT display, a DLP display, a plasma display, an OLED display, an LED display, a three-dimensional projection, an audio display, or a combination thereof. Furthermore, an RF sub-system/baseband processor 1510 may also be coupled to the processor 1502. The RF sub-system/baseband processor 1510 may include an antenna that is coupled to an RF receiver and to an RF transmitter (not shown). A communication port 1512, or more than one communication port 1512, may also be coupled to the processor 1502. The communication port 1512 may be adapted to be coupled to one or more peripheral devices 1514, such as a modem, a printer, a computer, a scanner, or a camera, or to a network, such as a local area network, remote area network, intranet, or the Internet, for example.

The processor 1502 may control the electronic system 1500 by implementing software programs stored in the memory 1516, 1518. The software programs may include an operating system, database software, drafting software, word processing software, media editing software, or media playing software, for example. The memory 1516, 1518 is operably coupled to the processor 1502 to store and facilitate execution of various programs. For example, the processor 1502 may be coupled to system memory 1516, which may include one or more of spin torque transfer magnetic random access memory (STT-MRAM), magnetic random access memory (MRAM), dynamic random access memory (DRAM) (e.g., synchronous DRAM (SDRAM) conforming with a double data rate (DDR) and/or graphics DDR (GDDR) standard (GDDR5, GDDR6, GDDR7)), static random access memory (SRAM), racetrack memory, and other known memory types. The system memory 1516 may include volatile memory, non-volatile memory, or a combination thereof. The system memory 1516 is typically large so that it can store dynamically loaded applications and data. In some embodiments, the system memory 1516 may include one or more ball grid arrays (or other arrayed electrical interconnects) and associated signal configurations in accordance with this disclosure, such as the ball grid arrays and associated signal configurations described above.

The processor 1502 may also be coupled to non-volatile memory 1518, which is not to suggest that system memory 1516 is necessarily volatile. The non-volatile memory 1518 may include one or more of STT-MRAM, MRAM, read-only memory (ROM) such as an EPROM, resistive read-only memory (RROM), and flash memory to be used in conjunction with the system memory 1516. The size of the non-volatile memory 1518 is typically selected to be just large enough to store any necessary operating system, application programs, and fixed data. Additionally, the non-volatile memory 1518 may include a high-capacity memory such as disk drive memory, such as a hybrid-drive including resistive memory or other types of non-volatile solid-state memory, for example. In some embodiments, the non-volatile memory 1518 may include one or more ball grid arrays (or other arrayed electrical interconnects) and associated signal routing configurations in accordance with this disclosure, such as the ball grid arrays and associated signal routing configurations described above.

In some embodiments, the electronic system 1500 may include a graphics subsystem, such as a graphics card 1520, connected to the processor 1502. For example, each of the graphics card 1520 and the processor 1502 may be connected to, and supported on, a motherboard in their respective sockets (e.g., a peripheral component interconnect express (PCIe) socket for the graphics card 1520, a CPU socket for the processor 1502). The graphics card 1520 may include its own processing device, such as a graphics processing unit (GPU) or field-programmable gate array (FPGA) 1522. The GPU or FPGA 1522 may be configured to, and may be a dedicated device for, processing graphics-related tasks to accelerate the creation of images in a frame buffer intended for output to the display 1508. The graphics card 1520 may also include a memory bank, such as, for example, a graphics memory block 1524, which may include one or more high-speed memory devices connected to the GPU or FPGA 1522 and configured to store and facilitate acceleration of graphics-related data. More specifically, the graphics memory block 1524 may include one or more banks of devices configured as dynamic random access memory (DRAM) (e.g., synchronous DRAM (SDRAM) conforming with a double data rate (DDR) and/or graphics DDR (GDDR) standard (GDDR5, GDDR6, GDDR7)). In some embodiments, one or more of the graphics subsystem, graphics card 1520, GPU or FPGA 1522, and/or graphics memory block 1524 may include one or more ball grid arrays (or other arrayed electrical interconnects) and associated signal routing configurations in accordance with this disclosure, such as the ball grid arrays and associated signal routing configurations described above. For example, one or more balls of the graphics memory block 1524 may be configured to communicate data, command/address information, or both, from the GPU or FPGA 1522 with the processor 1502.

In other words, electronic systems in accordance with this disclosure may include an input device, an output device, at least one processor, and at least one memory device, each operatively interconnected to one another. The at least one memory device may include microelectronic device packages may include a device substrate including a microelectronic device and bond pads proximate to an active surface of the device substrate. A package substrate may be secured to the device substrate, the package substrate configured to route signals to and from the bond pads. A ball grid array may be supported on, and electrically connected to, the package substrate. Each ball of the ball grid array positioned and configured to carry one of a high-bandwidth data signal or a high-frequency clock signal may be located laterally or longitudinally adjacent to no more than one other ball of the ball grid array configured to carry another of a high-bandwidth data signal or a high-frequency clock signal. In some such embodiments, each ball of the ball grid array positioned and configured to carry a high-bandwidth data signal is located only diagonally adjacent to any other directly adjacent balls configured to carry another of a high-bandwidth data signal or a high-frequency clock signal.

Embodiments of ball grid arrays in accordance with this disclosure may reduce crosstalk and improve signal quality, particularly at high bandwidths and clock speeds. For example, embodiments of ball grid arrays and associated signal routing between the ball grid arrays and connected microelectronic devices may distribute balls of the ball grid array configured to carry high-bandwidth data signals, high-frequency clock signals, error detect codes, or data bus inversions and, optionally, other balls of the ball grid array configured to carry low-bandwidth data signals, to reduce adjacency between such balls. Such a configuration may increase the likelihood of a signal carried by the ball grid array to form a valid eye, particularly when working with multilevel signal modulation formats. For example, ball grid arrays in accordance with this disclosure may mitigate crosstalk, and maintain signal quality, when used in connection with PAM4 signal formatting.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure.

What is claimed is:

1. An apparatus, comprising:
    a device substrate comprising a microelectronic device and bond pads coupled with an active surface of the device substrate;
    a package substrate secured to the device substrate, the package substrate configured to route signals to and from the bond pads; and
    a ball grid array supported on, and electrically connected to, the package substrate;
    wherein each ball of the ball grid array positioned and configured to carry one of a high-bandwidth data signal or a high-frequency clock signal is located adjacent to no more than three other balls of the ball grid array configured to carry another of a high-bandwidth data signal or a high-frequency clock signal in locations surrounding each respective ball.

2. The apparatus of claim 1, wherein each ball of the ball grid array positioned and configured to carry one of a high-bandwidth data signal or a high-frequency clock signal is located adjacent to no more than two other balls of the ball grid array configured to carry another of a high-bandwidth data signal or a high-frequency clock signal in locations surrounding each respective ball.

3. The apparatus of claim 1, wherein each ball of the ball grid array positioned and configured to carry one of a high-bandwidth data signal or a high-frequency clock signal is located laterally or longitudinally adjacent to no more than one other ball of the ball grid array configured to carry another of a high-bandwidth data signal or a high-frequency clock signal.

4. The apparatus of claim 1, wherein each ball of the ball grid array positioned and configured to carry one of an error detect code or a data bus inversion is located laterally or longitudinally adjacent to no more than two other balls of the ball grid array configured to carry another of a high-bandwidth data signal, a high-frequency clock signal, an error detect code, or a data bus inversion.

5. The apparatus of claim 1, wherein each ball of the ball grid array positioned and configured to carry a data signal of any bandwidth within a given quadrant of the ball grid array is located laterally or longitudinally adjacent to no more than two other balls of the ball grid array configured to carry another data signal of any bandwidth within a same quadrant of the ball grid array.

6. The apparatus of claim 1, wherein a majority of balls of the ball grid array located laterally and longitudinally adjacent to each ball of the ball grid array configured to carry a high-bandwidth data signal or a high-frequency clock signal is configured to carry voltage or ground.

7. The apparatus of claim 6, wherein at most two other balls of the ball grid array are interposed laterally or longitudinally between adjacent balls of the ball grid array positioned and configured to carry a high-bandwidth data signal or a high-frequency clock signal.

8. The apparatus of claim 1, wherein each ball of the ball grid array positioned and configured to carry one of a high-bandwidth data signal or a high-frequency clock signal is located laterally or longitudinally adjacent to no other ball of the ball grid array configured to carry another of a high-bandwidth data signal or a high-frequency clock signal.

9. The apparatus of claim 1, wherein the bond pads comprise two rows of bond pads located at least substantially centrally on, and distal from a lateral periphery of, the active surface of the device substrate.

10. The apparatus of claim 1, wherein each ball of the ball grid array positioned and configured to carry a high-bandwidth data signal is located only diagonally adjacent to any other directly adjacent balls configured to carry another of a high-bandwidth data signal or a high-frequency clock signal.

11. The apparatus of claim 1, wherein each ball of the ball grid array positioned and configured to carry one of a high-bandwidth data signal or a high-frequency clock signal is located diagonally adjacent to no more than two other directly adjacent balls of the ball grid array configured to carry another of a high-bandwidth data signal or a high-frequency clock signal.

12. The apparatus of claim 1, wherein each ball of the ball grid array located laterally and longitudinally adjacent to each ball of the ball grid array configured to carry a high-bandwidth data signal is configured to carry a voltage, connect to ground, or carry a low-bandwidth data signal.

13. The apparatus of claim 12, wherein at most two other balls of the ball grid array are interposed laterally or longitudinally between proximate balls of the ball grid array positioned and configured to carry one of a high-bandwidth data signal or a high-frequency clock signal.

14. The apparatus of claim 1, wherein the ball grid array lacks multiple balls positioned and configured to carry high-bandwidth data signals and high-frequency clock signals in sequential adjacency laterally across a row or longitudinally along a column.

15. The apparatus of claim 1, wherein each ball of the ball grid array positioned and configured to carry a high-frequency clock signal within a quadrant of the ball grid array is located in a first column on a first lateral side of the quadrant, and each ball of the ball grid array positioned and configured to carry an error detect code or a data bus inversion within the quadrant is located in a second column on a second, opposite lateral side of the quadrant of the ball grid array.

16. A system, comprising:
  a central processing unit (CPU), a graphics processing unit (GPU), or a field programmable gate array (FPGA), or any combination thereof; and
  at least one memory device connected to the CPU, the GPU, or the FPGA, the at least one memory device comprising:
    a device substrate comprising a microelectronic device and bond pads proximate to an active surface of the device substrate;
    a package substrate secured to the device substrate, the package substrate configured to route signals to and from the bond pads; and
    a ball grid array supported on, and electrically connected to, the package substrate;
    wherein each ball of the ball grid array positioned and configured to carry one of a high-bandwidth data signal or a high-frequency clock signal is located adjacent to no more than three other balls of the ball grid array configured to carry another of a high-bandwidth data signal or a high-frequency clock signal in locations surrounding each respective ball.

17. The system of claim 16, wherein each ball of the ball grid array positioned and configured to carry a high-bandwidth data signal is located only diagonally adjacent to any other directly adjacent balls configured to carry another of a high-bandwidth data signal or a high-frequency clock signal.

18. The system of claim 16, wherein each ball of the ball grid array positioned and configured to carry one of a high-bandwidth data signal or a high-frequency clock signal is located laterally or longitudinally adjacent to no more than one other ball of the ball grid array configured to carry another of a high-bandwidth data signal or a high-frequency clock signal.

19. A method, comprising:
  securing a package substrate to a device substrate, the device substrate comprising bond pads proximate to an active surface of the device substrate, the package substrate configured to route signals to and from the bond pads; and
  supporting a ball grid array on, and electrically connecting the ball grid array to, the package substrate, such that each ball of the ball grid array positioned and configured to carry one of a high-bandwidth data signal or a high-frequency clock signal is located adjacent to no more than three other balls of the ball grid array configured to carry another of a high-bandwidth data signal or a high-frequency clock signal in locations surrounding each respective ball.

20. The method of claim 19, wherein supporting the ball grid array on, and electrically connecting the ball grid array to, the package substrate comprises supporting the ball grid array on, and electrically connecting the ball grid array to, the package substrate, such that each ball of the ball grid array positioned and configured to carry a high-bandwidth data signal is located only diagonally adjacent to any other directly adjacent balls configured to carry another of a high-bandwidth data signal or a high-frequency clock signal.

* * * * *